US011145690B2

(12) United States Patent
Wu

(10) Patent No.: US 11,145,690 B2
(45) Date of Patent: Oct. 12, 2021

(54) MEMORY DEVICE AND MANUFACTURING METHOD THEREOF

(71) Applicant: TAIWAN SEMICONDUCTOR MANUFACTURING CO., LTD., Hsinchu (TW)

(72) Inventor: Jau-Yi Wu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/584,713

(22) Filed: Sep. 26, 2019

(65) Prior Publication Data
US 2021/0098532 A1 Apr. 1, 2021

(51) Int. Cl.
*H01L 47/00* (2006.01)
*H01L 27/24* (2006.01)
*H01L 45/00* (2006.01)

(52) U.S. Cl.
CPC ...... *H01L 27/2436* (2013.01); *H01L 45/1206* (2013.01); *H01L 45/1253* (2013.01); *H01L 45/1608* (2013.01); *H01L 45/1666* (2013.01)

(58) Field of Classification Search
CPC ............ H01L 27/2436; H01L 45/1206; H01L 45/1253; H01L 45/1608; H01L 45/1666
USPC ............................................................. 257/4
See application file for complete search history.

(56) References Cited

U.S. PATENT DOCUMENTS

| | | | |
|---|---|---|---|
| 2009/0230375 A1* | 9/2009 | Liang .................... | H01L 45/148 257/2 |
| 2011/0266511 A1* | 11/2011 | Shen ...................... | H01L 45/16 257/3 |
| 2020/0044148 A1* | 2/2020 | Trinh ................. | G11C 13/0004 |

* cited by examiner

*Primary Examiner* — Long K Tran
(74) *Attorney, Agent, or Firm* — Maschoff Brennan

(57) ABSTRACT

A memory device includes a dielectric layer, a bottom electrode, an inter-metal dielectric (IMD) layer, a phase change element in the IMD layer, and a top electrode. The bottom electrode is in the dielectric layer. The IMD layer is over first dielectric layer. The phase change element is in the IMD layer. The top electrode is over the phase change element and is separated from the dielectric layer by at least an air gap free of materials of the IMD layer and the phase change element.

20 Claims, 19 Drawing Sheets

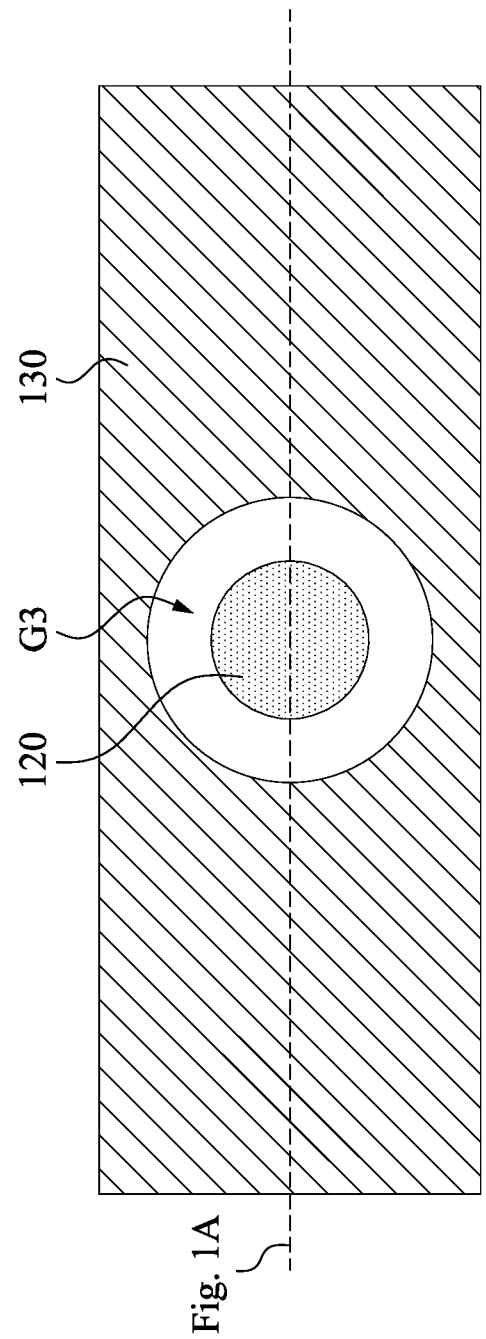

MEMORY DEVICE AND MANUFACTURING METHOD THEREOF

BACKGROUND

Flash memory is a widely used type of nonvolatile memory. However, flash memory is expected to encounter scaling difficulties. Therefore, alternatives types of nonvolatile memory are being explored. Among these alternatives types of nonvolatile memory is phase change memory (PCM). PCM is a type of nonvolatile memory in which a phase of a phase change element is employed to represent a unit of data. PCM has fast read and write times, non-destructive reads, and high scalability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1B is a top view of FIG. 1A.

DETAILED DESCRIPTION

Figure 1A:
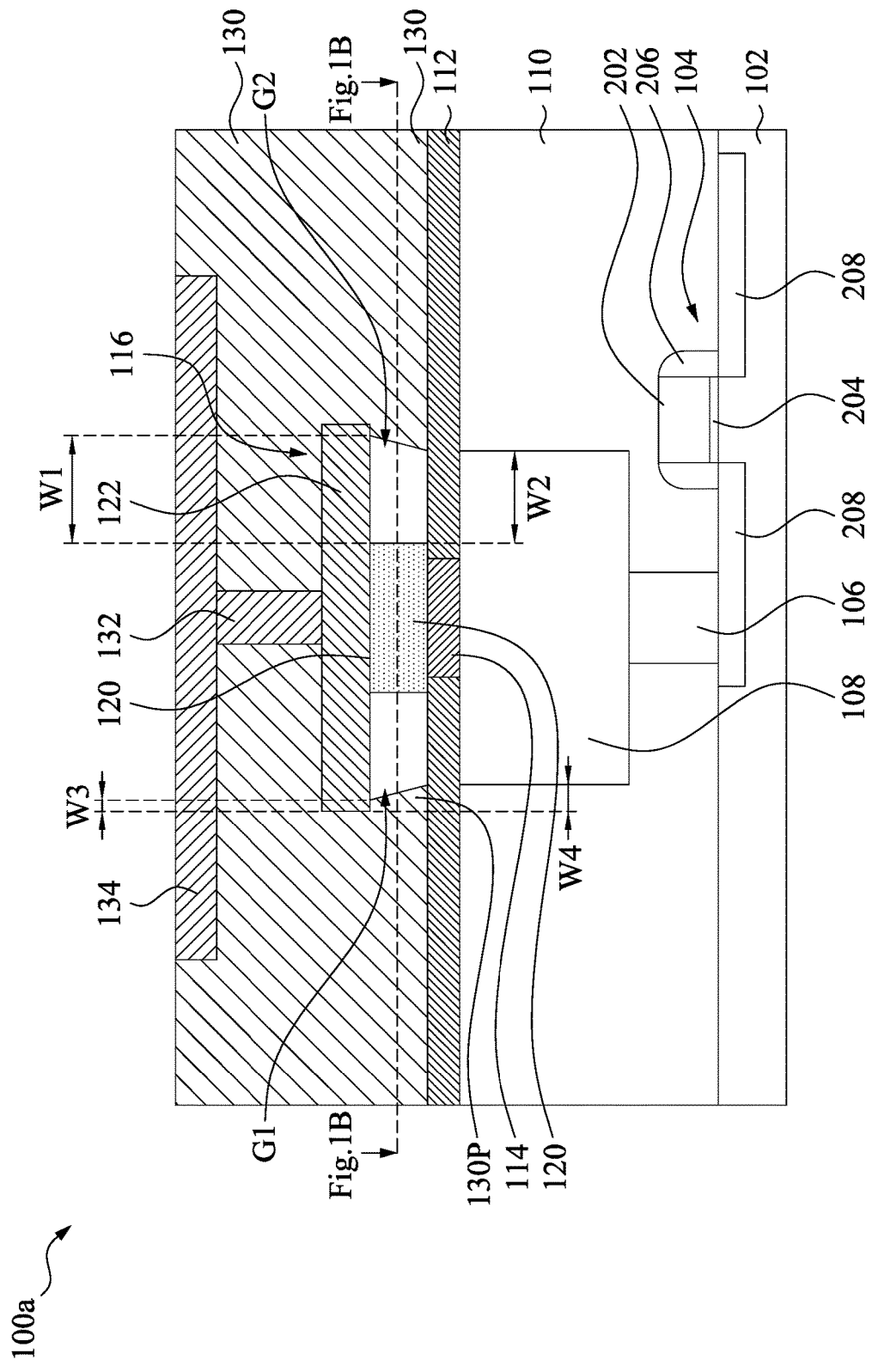
FIG. 1A is a cross-sectional view of a memory device in according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A phase change memory (PCM) cell includes a phase change element (PCE) sandwiched between a bottom electrode and a top electrode. In some embodiments, the PCE is made of chalcogenide glass. Chalcogenide glass has crystalline and amorphous states with drastically different electrical resistivity values, such that the PCE can be switched between the crystalline and amorphous states to correspond to different data states. More particularly, during operation of some PCM cells, the PCE can be heated to a higher temperature (e.g., over 600 degrees Celsius) than its melting point, which causes the chalcogenide glass to lose its crystallinity. The PCE can then be quickly cooled or "quenched" to "freeze" the PCE in an amorphous, high resistance state, which can for example correspond to a "0" data state. This operation can be referred to as a "reset" operation of the PCM cell. Conversely, by heating the chalcogenide to a lower temperature (e.g., about 100-150 degrees Celsius), wherein the lower temperature is above its crystallization point but below its melting point, the PCE will transform into the low-resistance, crystalline state, which can for example correspond to a "1" state. This operation can be referred to as a "set" operation of the PCM cell.

Referring to FIG. 1A, a cross-sectional view of a memory device 100a in accordance with some embodiments is provided. Referring to FIG. 1B, a top view of FIG. 1A's memory device 100a as indicated in the cut-away lines shown in FIG. 1A in accordance with some embodiments is provided.

The memory device 100a includes a phase change memory (PCM) cell 116. The PCM cell 116 includes a bottom electrode 114, a phase change element (PCE) 120, and a top electrode 122. The bottom electrode 114 is disposed within a dielectric layer 112. The PCE 120 overlies the bottom electrode 114. The top electrode 122 overlies the PCE 120. The PCE 120 and the top electrode 122 are disposed within an inter-metal dielectric (IMD) layer 130.

In some embodiments, the PCM cell 116 is disposed over a substrate 102 with an inter-metal dielectric (IMD) layer 110 disposed over the substrate 102. A bottom conductive wire 108 overlying a bottom interconnect via 106 electrically couples the PCM cell 116 to a transistor 104. In some embodiments, the bottom conductive wire 108 and bottom interconnect via 106 electrically couple the PCM cell 116 to underlying metal layers and/or an electrical component such as a resistor, a capacitor, and/or a diode. A conductive via 132 is disposed over the top electrode 122 and within the IMD layer 130, and connects the top electrode 122 to upper metal layers such as an upper conductive wire 134 in the IMD layer 130. In some embodiments, the conductive via 132 and the upper conductive wire 134 may electrically couple the top electrode 122 to a bit line (not shown).

In some embodiments, during operation of the PCM cell 116, the PCM cell 116 varies between states depending upon a voltage applied from the upper conductive wire 134 to the bottom conductive wire 108. The PCM cell 116 may, for example, be in a low-resistance state where the PCE 120 is in a crystalline phase. Changing the PCE 120 to the crystalline phase (i.e., set operation) may, for example, be performed by heating the PCE 120 to a relatively low temperature (e.g., higher than crystallization point of the PCE 120 but lower than the melting point of the PCE 120) using Joule heating resulting from an electric current flowing through the PCE 120. The electric current flowing through the PCE 120 in the set operation is referred to as a set current $I_{set}$. On the other hand, the PCM cell 116 may, for example, be in a high resistance state where the PCE 120 is in an amorphous phase. Changing the PCE 120 to the amorphous phase (i.e., reset operation) may, for example, be performed by heating the PCE 120 to a relatively high temperature (e.g., higher than the melting point of the PCE 120) using Joule heating resulting from another electric current flowing through the PCE 120. The electric current flowing through the PCE in the reset operation is referred to as a reset current $I_{reset}$.

In some embodiments, a plurality of air gaps G1 and G2 are presented at opposite sides of the PCE 120. In some embodiments, the air gaps G1 and G2 are under the top electrode 122 of the PCM cell 116. The PCE 120 is narrower than the top electrode 122. Stated differently, the PCE 120 has a width less than a width of the top electrode 122. For example, the width of the PCE 120 is in a range from about 10 nm to about 100 nm, and the width of the top electrode 122 is in a range from about 100 nm to about 200 nm. In some embodiments, the sidewalls of the PCE 120, bottom surface of the top electrode 122, sidewalls of the IMD layer 130, and the top surface of the dielectric layer 112 are in the air gaps G1 and G2.

In some embodiments, the air gaps G1 and G2 are defined from a cross-sectional view. For example, if when viewed from above the PCE 120 is circular/elliptical, then the air gaps G1 and G2 are a single continuous air gap G3, therefore the air gaps G1 and G2 refers to the nature of this single continuous air gap G3 when depicted in in a cross-sectional view, as shown in FIG. 1A. Additionally, if when viewed from above the PCE 120 is circular or elliptical, then the width associated with a cross-sectional view of the layers comprising the PCE 120 respectively correspond to diameters of a circle or lengths defined between two vertices on the major axis of an ellipse.

In some embodiments, the PCE 120 is wider than the bottom electrode 114. The air gaps G1 and G2 have an inverted trapezoid shape when depicted in a cross-sectional view as shown in FIG. 1A. In greater detail, the air gaps G1 and G2 have widths increasing as a distance from the dielectric layer 112 increases. For example, the air gap G2 has a top width W1 at its top (i.e., at bottom surface of the top electrode 122) and a bottom width W2 at its bottom (i.e., at top surface of the dielectric layer 112), and the top width W1 is greater than the bottom width W2. On the other hand, the IMD layer 130 has portions 130P that extend to positions under the top electrode 122 and may terminate prior to reaching the PCE 120. The portions 130P extend between the bottom surface of the top electrode 122 and the top surface of the dielectric layer 112 but separated from sidewalls of the PCE 120. In some embodiments, the portions 130P have tapered profile. In greater detail, the portions 130P taper from the bottom electrode 114 (or the dielectric layer 112) toward the top electrode 122. For example, the portion 130P has a top width W3 at its top and a bottom width W4 at its bottom, and the top width W3 is smaller than the bottom width W4. Stated another way, the width of the portion 130P decreases as a distance from the dielectric layer 112 increases. In some embodiments, the air gaps G1 and G2 are defined by the top electrode 122, the PCE 120, the dielectric layer 112, and the portions 130P of the IMD layer 130. The portions 130P of IMD layer 130 laterally surround the air gaps G1 and G2, and have sidewalls exposed to the air gaps G1 and G2. In some embodiments, the portions 130P of IMD layer 130, the air gaps G1 and G2, and the PCE 120 have substantially the same height.

In some embodiments, the PCE 120 may, for example, be or include chalcogenide materials, which consist of at least one chalcogen ion (e.g., a chemical element in column VI of the period table), sulfur (S), selenium (Se), tellurium (Te), selenium sulfide (SeS), germanium antimony tellurium (GeSbTe), silver indium antimony tellurium (AgInSbTe), or the like.

In some embodiments, the top electrode 122 and the bottom electrode 114 may be or include the same material as one another. In some embodiments, the top electrode 122 and/or the bottom electrode 114 may, for example, respectively be or include titanium nitride (TiN), titanium tungsten (TiW), titanium tungsten nitride (TiWN), titanium tantalum nitride (TiTaN), tantalum nitride (TaN), tungsten (W), or the like. In some embodiments, the conductive via 132 and the upper conductive wire 134 may, for example, respectively be or comprise copper (Cu), aluminum (Al), or the like. In some embodiments, the dielectric layer 112 may, for example, be or comprise SiN, SiC, SiON, SiOC, or the like. In some embodiments, the IMD layer 130 may, for example, be or comprise tetra-ethyl-ortho-silicate (TEOS) (e.g., plasma enhanced TEOS, low particle TEOS, etc.), an extreme low dielectric, or the like.

The transistor 104 includes gate electrode 202, gate dielectric 204, transistor sidewall spacers 206, and source/drain regions 208. The bottom interconnect via 106 is electrically coupled to a source/drain region 208 of the transistor 104. The source/drain regions 208 are disposed within the substrate 102 on either side of the gate electrode 202. Further, the source/drain regions 208 are doped to have a first conductivity type which is opposite a second conductivity type of a channel region under the gate dielectric 204. The gate electrode 202 may be, for example, doped polysilicon or a metal, such as aluminum, copper, tungsten, or combinations thereof. The gate dielectric 204 may be, for example, an oxide, such as silicon dioxide, or a high-k dielectric material. The transistor sidewall spacers 206 can be made of silicon nitride (e.g., $Si_3N_4$), for example.

Figure 2:
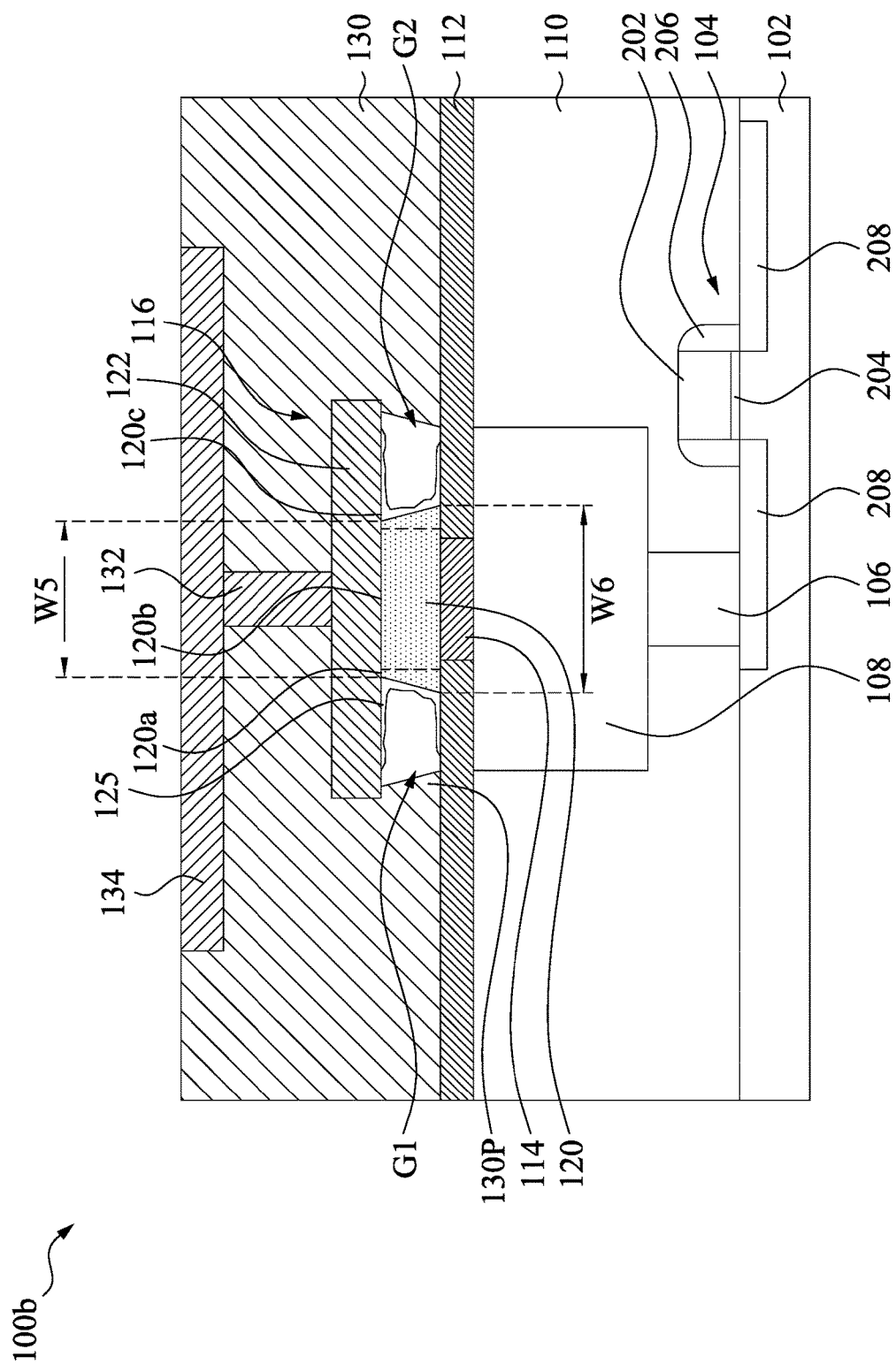
FIG. 2 is a cross-sectional view of a memory device in according to some embodiments of the present disclosure.

Referring to FIG. 2, a cross-sectional view of a memory device 100b in accordance with some embodiments is provided. Different from the memory device 100a in FIG. 1A, the PCE 120 includes a first outer region 120a, a second outer region 120c, and a center region 120b, in which the center region 120b is surrounded by the first outer region 120a and the second outer region 120c and is substantially free from a material in the first and second outer regions 120a and 120c. In some embodiments, the center region 120b may include chalcogenide material such as GeSbTe. On the other hand, the first and second outer regions 120a and 120c may include a compound of the chalcogenide material and a first reactive species, which results from an etching process performed to pattern the top electrode 122 and the PCE 120, which will be discussed in greater detail below. In some embodiments, the first reactive species may, for example, be or comprise a halogen element (e.g., group 17 element) such as fluorine (F), chlorine (Cl), bromine (Br), iodine (I), and/or astatine (At). In some embodiments, the center region 120b is substantially free from the first reactive species.

In some embodiments, the memory device 100b of FIG. 2 includes a plurality of polymer residues 125 on sidewalls of the PCE 120, the bottom surface of the top electrode 122, and/or top surface of the dielectric layer 112. The polymer residues 125 result from an etch process performed to narrow down the PCE 120, which will be discussed in greater detail below. Further, the PCE 120 in FIG. 2 has an upward tapered profile (i.e., trapezoidal shape) with a width decreasing as a distance from the underlying dielectric layer 112 increases. For example, the top surface of the PCE 120 has a width W5, and the bottom surface of the PCE 120 has a width W6, in which the width W5 is smaller than the width W6. Stated another way, the PCE 120 tapers from the bottom electrode 114 toward the top electrode 122. In some embodiments, the air gaps G1 and G2 in FIG. 2 have inverted trapezoid profile as described in FIG. 1A. Because the air gaps G1 and G2 are inverted-trapezoidal and the PCE 120 is trapezoidal, the PCE 120 tapers in a direction opposite the direction in which the air gaps G1 and G2 tapered.

In some embodiments, the polymer residues 125 includes a compound of a material of the chalcogenide material of the PCE 120 (e.g., GeSbTe), the first reactive species in the outer regions 120a, 120c of the PCE 120 and a second reactive species different from the first reactive species. The second reactive species results from an etching process performed to narrow the PCE 120, which will be discussed in greater detail below. In some embodiments, the first and second outer regions 120a and 120c include a compound of the chalcogenide material and the first reactive species but substantially free from the second reactive species. In some embodiments, the second reactive species may, for example, be or comprise a different halogen element (e.g., fluorine, chlorine, bromine, or other group 17 element) than the first reactive species as discussed previously. In some other embodiments, the second reactive species may, for example, be or comprise phosphorus (P), sulfur (S), and/or nitrogen (N).

Figure 3:
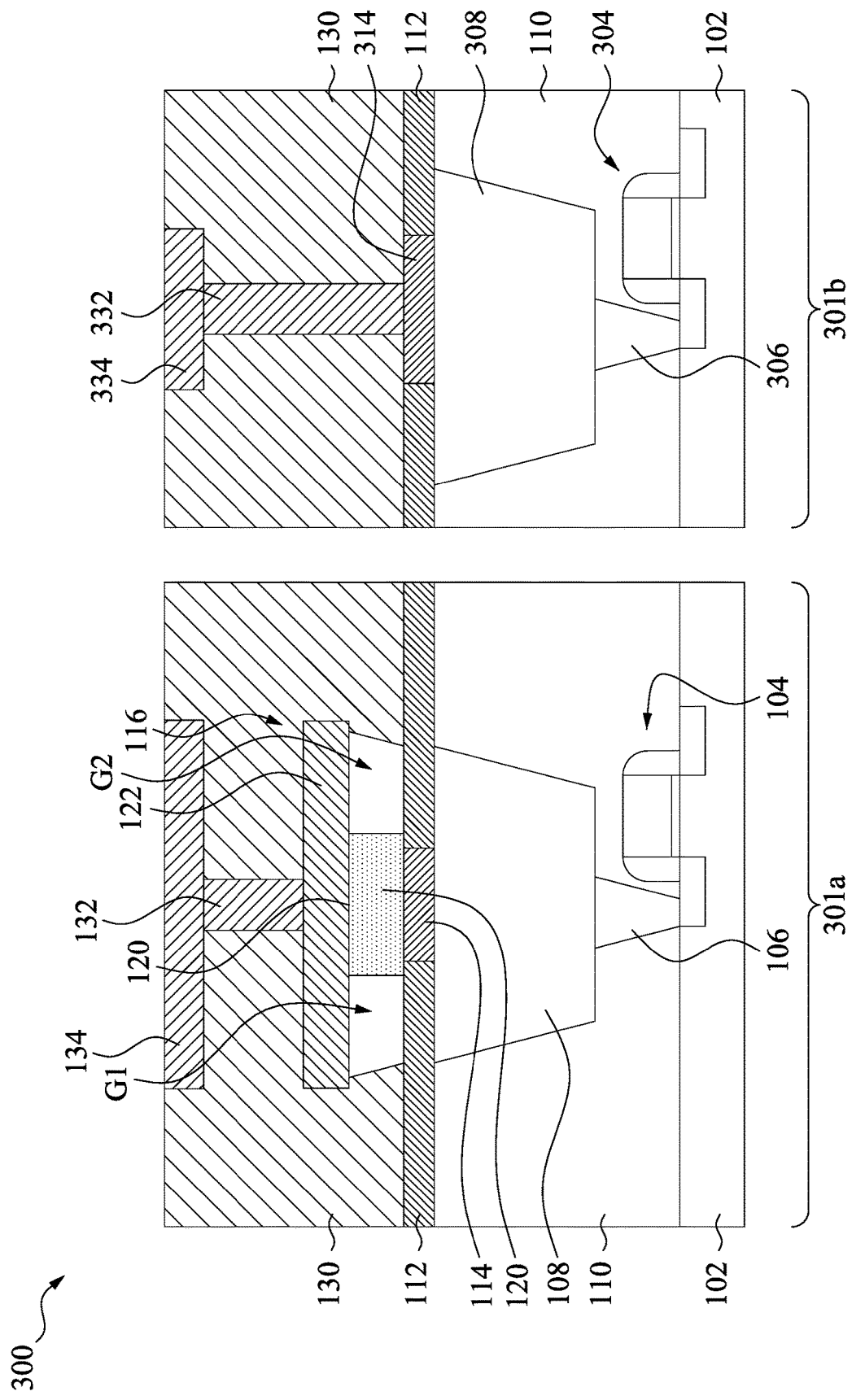
FIG. 3 is a cross-sectional view of a memory device in according to some embodiments of the present disclosure.

Referring to FIG. 3, in accordance with some embodiments, a cross-sectional view of a memory device 300 including a memory array region 301a including a PCM cell 116 and a logic region 301b is provided.

In various embodiments, the substrate 102, the transistor 104, the bottom interconnect via 106, the IMD layers 110 and 130, the dielectric layer 112, the PCM cell 116, the bottom conductive wire 108, the conductive via 132, and the upper conductive wire 134 within the memory array region 301a are similar or the same as the PCM cell 116 of FIG. 1A is described and labeled. Thus, relevant structural details will not be repeated hereinafter for brevity. In some embodiments, the substrate 102, the IMD layers 110 and 130, and the dielectric layer 112 extend continuously from the memory array region 301a to the logic region 301b.

Within the logic region 301b, a transistor 304 is disposed within the substrate 102 and the IMD layer 110. The transistor 304 is electrically coupled to an interconnect wire 308 via a conductive contact 306. A conductive via 314 is disposed in the dielectric layer 112. Another conductive via 322 is disposed within the IMD layer 130. In some embodiments, the conductive vias 314 and/or 322 may, for example, be or include Cu, Al, or the like. An upper conductive wire 334 is disposed within the IMD layer 130 and overlies the conductive via 332. In some embodiments, the upper conductive wire 334 may, for example, be or include Cu, Al, or the like.

Figure 4:
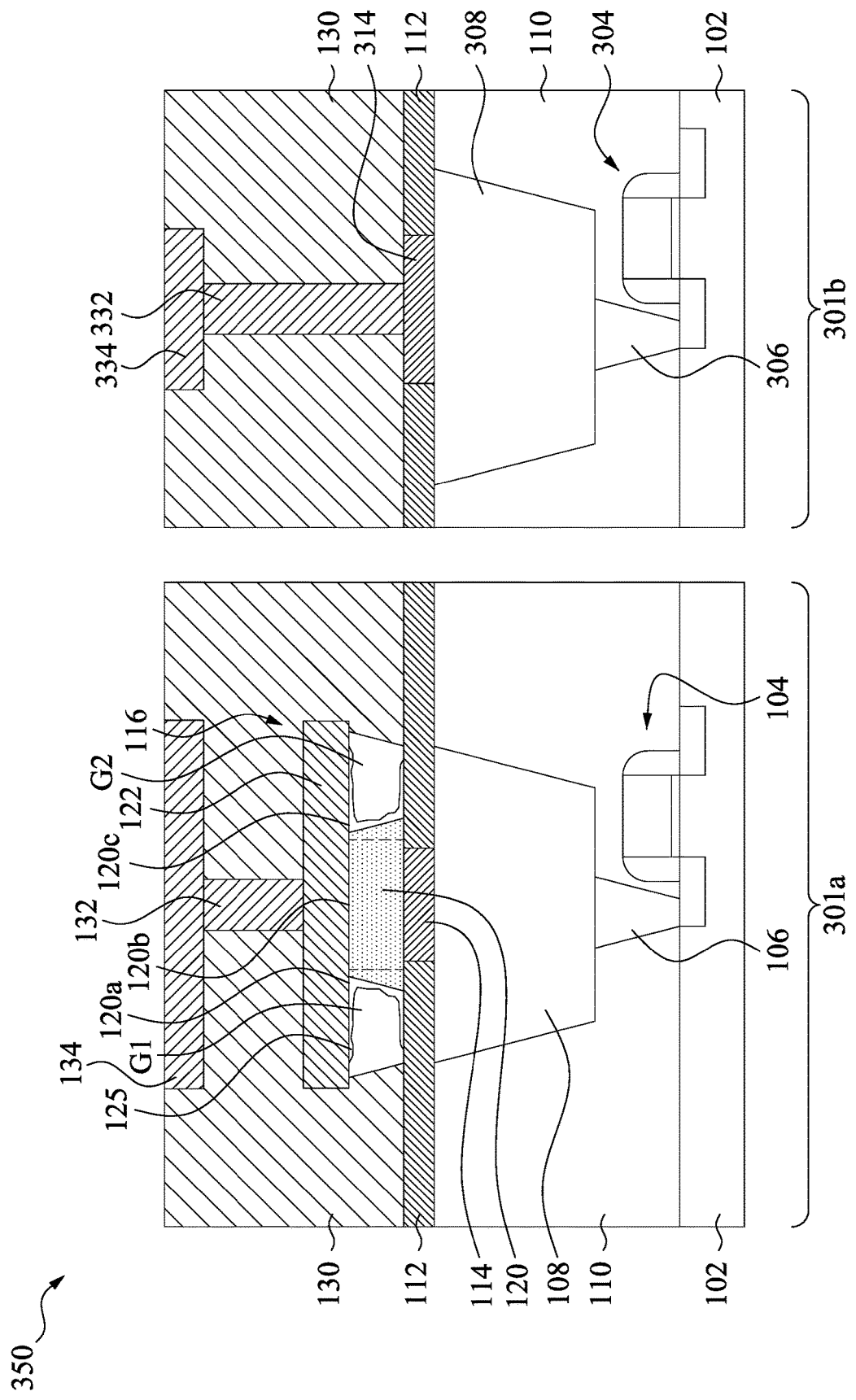
FIG. 4 is a cross-sectional view of a memory device in according to some embodiments of the present disclosure.

Referring to FIG. 4, a cross-sectional view of a memory device 350 including a memory array region 301a including a PCM cell 116 and a logic region 301b, in accordance with some embodiments is provided. The PCM cell 116 in FIG. 4 is similar to that described in FIG. 2, in which the PCE 120 includes the first outer region 120a, the second outer region 120c, and the center region 120b. Further, a plurality of polymer residues 125 are formed on sidewalls of the PCE 120, and the PCE 120 has an upward tapered profile (e.g., trapezoid shape). Relevant structural details will not be repeated hereinafter foe brevity.

FIGS. 5-13 illustrate cross-sectional views of some embodiments of a method of forming a memory device including a PCM structure according to the present disclosure. In greater details, FIGS. 5-13 illustrate a method for forming the memory array region 301a and the logic region 301b described in FIG. 3. It is noted that some elements of FIG. 3 (e.g., the transistors 104 and 304) are omitted in FIGS. 5-13 for brevity. Although the cross-sectional views shown in FIGS. 5-13 are described with reference to a method, it will be appreciated that the structures shown in FIGS. 5-13 are not limited to the method but rather may stand alone separate of the method. Although FIGS. 5-13 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
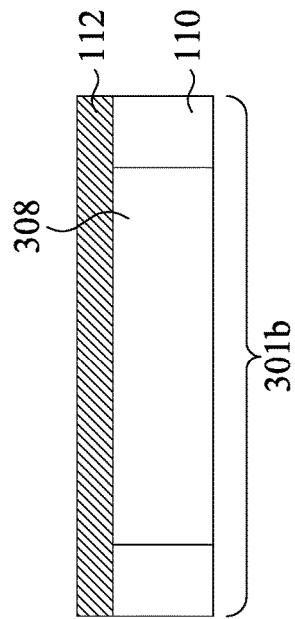
FIGS. 5-13 are cross-sectional views of a memory device in various stages of fabrication in accordance with some embodiments of the present disclosure.
Figure 5:
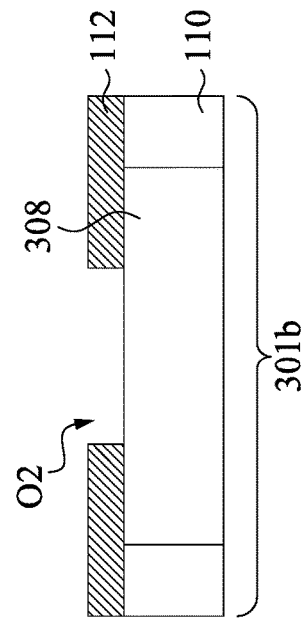
Figure 5:
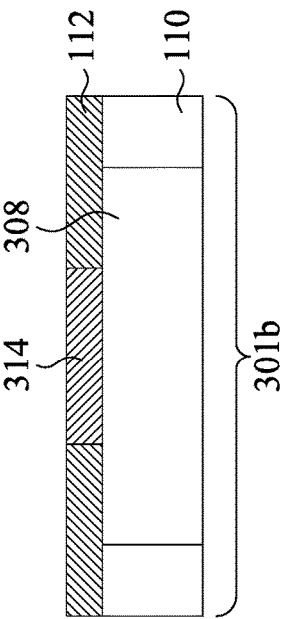
Figure 5:
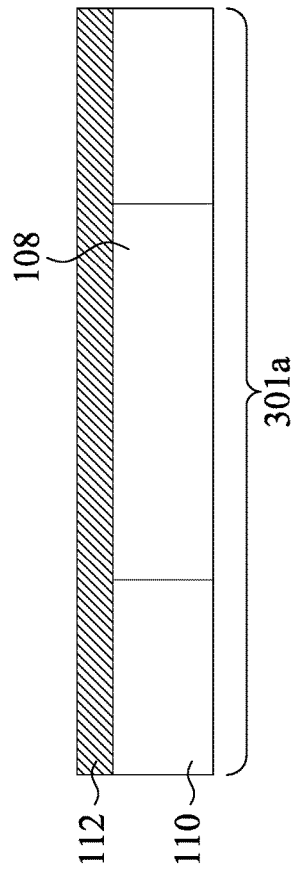

As shown in cross-sectional view of FIG. 5, an initial structure includes the IMD layer 110, the bottom conductive wire 108, the interconnect wire 308, and the dielectric layer 112. In some embodiments, the bottom conductive wire 108 is formed in the IMD layer 110 within the memory array region 301a, the interconnect wire 308 is formed in the IMD layer 110 within the logic region 301b, and the dielectric layer 112 is formed over the IMD layer 110 after formation of the wires 108 and 308. Formation of the bottom conductive wire 108 and the interconnect wire 308 may use a single-damascene or dual-damascene process. For example, formation of the wires 108 and 308 includes forming trenches in the IMD layer 110 and respectively within the memory array region 301a and the logic region 301b using suitable etching techniques, overfilling the trenches with one or more metal layers (TiN layer, TaN layer and/or copper layer) using suitable deposition techniques, and planarizing the one or more metal layers with the IMD layer 110 using, for example, one or more chemical mechanical polishing (CMP) processes.

Figure 6:
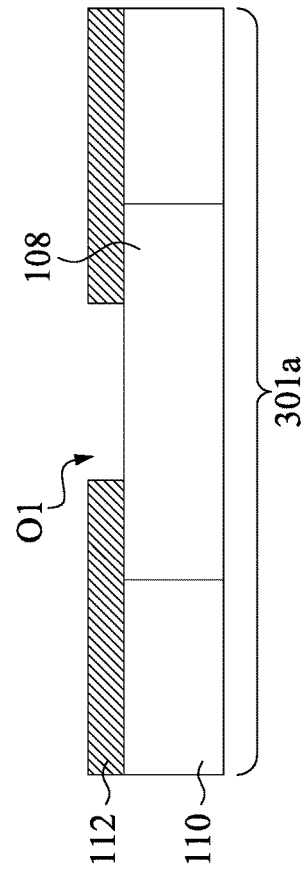

As shown in cross-sectional view of FIG. 6, the dielectric layer 112 is patterned to form an opening O1 and an opening O2 respectively in the memory array region 301a and the logic region 301b. The opening O1 exposes the top surface of the bottom conductive wire 108 and the opening O2 the top surface of the interconnect wire 308. In some embodiments, the openings O1 and O2 may be formed by, for example, forming a patterned mask (e.g., photoresist mask) over the dielectric layer 112, followed by etching the dielectric layer 112 using the patterned mask as an etch mask to form the openings O1 and O2 in the dielectric layer 112. After the etching process, the patterned mask is removed using, for example, an ashing process, if the patterned mask is made of photoresist. In this process flow, the openings O1 and O2 can be formed by using a single patterned mask. Stated another way, formation of the opening O1 in the memory array region 301a can share a same photoresist mask and hence a same photolithography process with formation of the opening O2 in the logic region 302b, thus reducing a number of photolithography processes in the back-end-of-line (BEOL) process. In some embodiments, the openings O1 and O2 formed using the same photolithography and etching process have substantially the same geometry (e.g., substantially the same size and shape). For example, the openings O1 and O2 may have a width difference (or diameter difference if they are circular holes) smaller than about 10 percent of the width (or diameter) of one of the openings O1 and O2.

Figure 7:
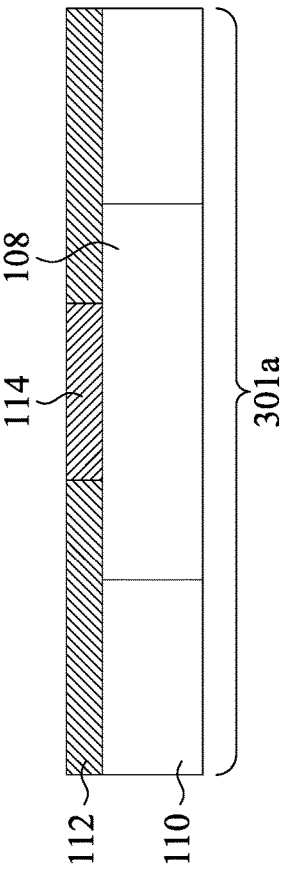

As shown in cross-sectional view of FIG. 7, the bottom electrode 114 and the conductive via 314 are formed respectively in the openings O1 and O2 (see FIG. 6). In some embodiments, the bottom electrode 114 and the conductive via 314 may be formed by depositing one or more metal layers into the openings O1 and O2, followed by performing one or more CMP processes to remove excess materials of the one or more metal layers outside the openings O1 and O2. In some embodiments, the one or more metal layers may include TiN, TaN, copper, and/or tungsten layers deposited by suitable processes, such as chemical vapor deposition (CVD), physical vapor deposition (PVD), atomic layer deposition (ALD), or the like.

Figure 8:
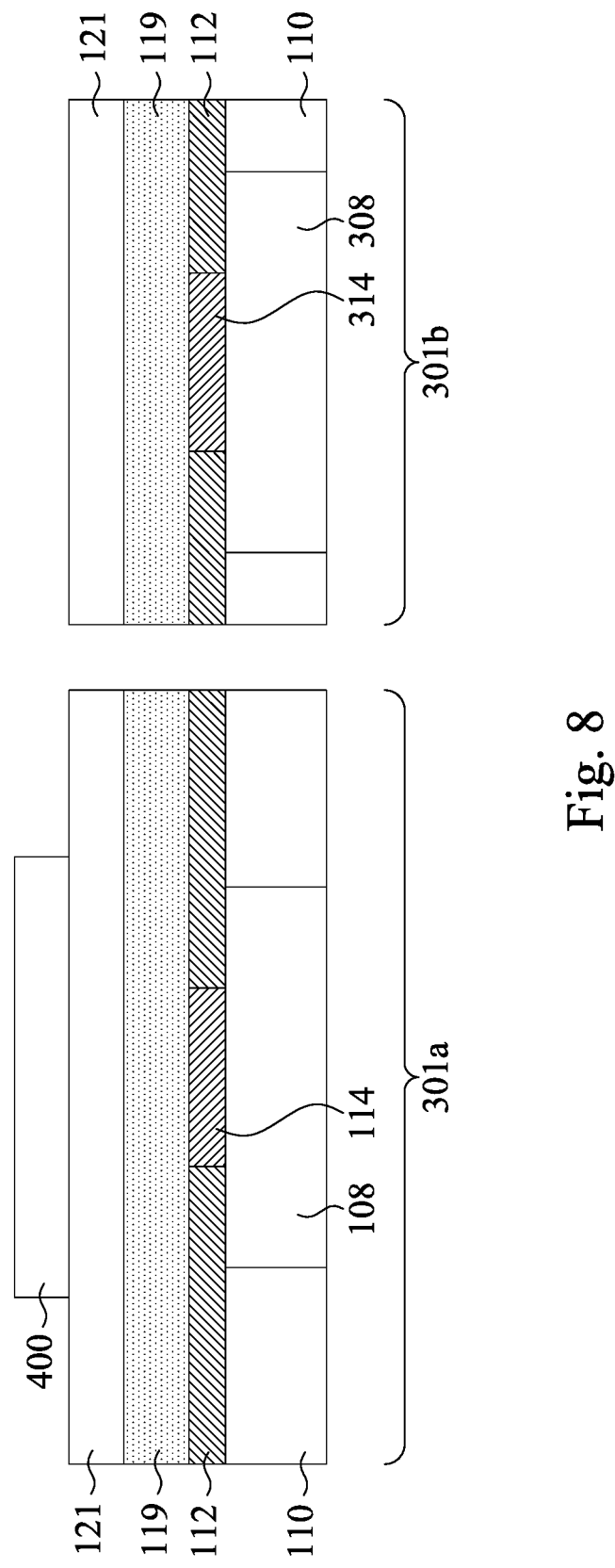

As shown in cross-sectional view of FIG. 8, a phase change material layer 119 and a top electrode layer 121 are formed over the dielectric layer 112, the bottom electrode 114, and the conductive via 314. In some embodiments, the phase change material layer 119 may be formed by suitable deposition process, such as CVD, PVD, ALD, or the like. In some embodiments, the top electrode layer 121 may be formed by suitable deposition process, such as CVD, PVD, ALD, or the like. Then, a patterned mask 400 is formed over the top electrode layer 121 within the memory array region 301a, in which the patterned mask 400 defines the position of the PCM cell (e.g., the PCM cell 116 in FIG. 1A). The patterned mask 400 may be formed using suitable photolithography techniques.

Figure 9:
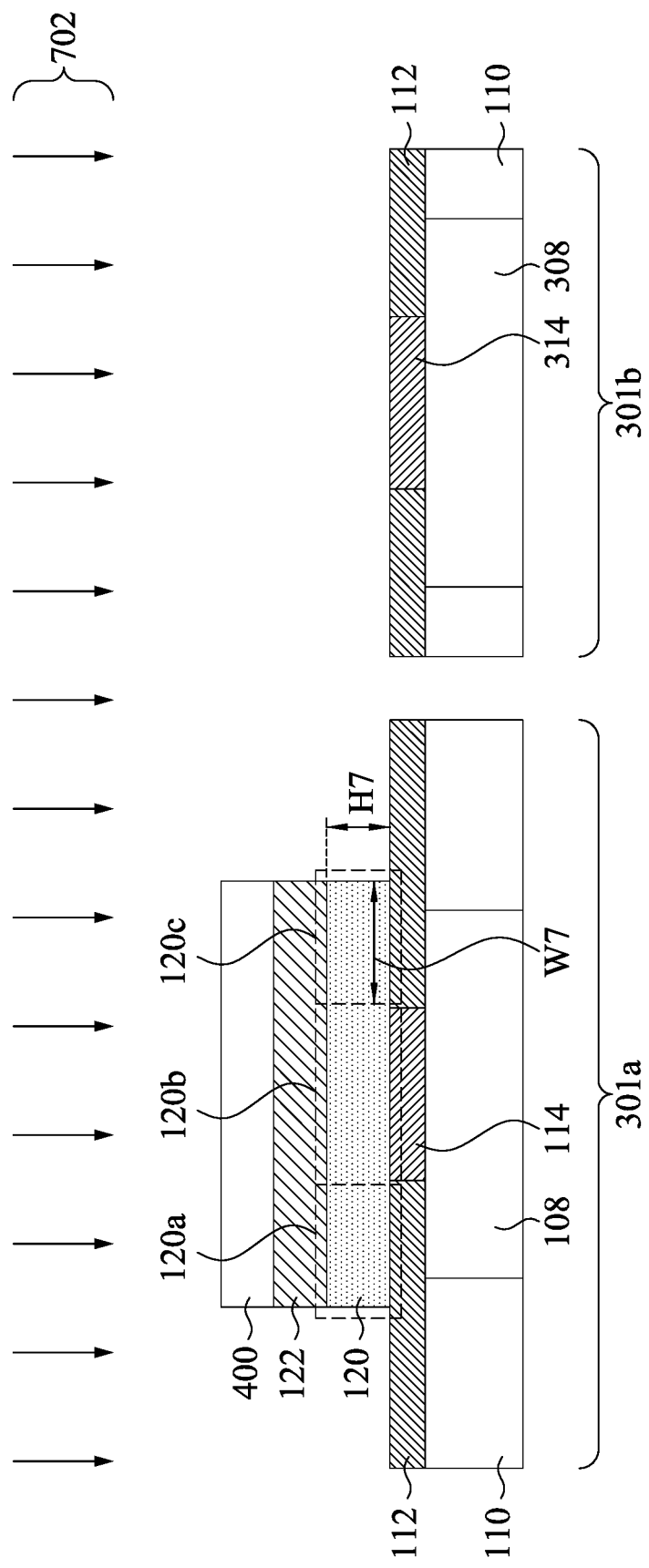

As shown in cross-sectional view of FIG. 9, the phase change material layer 119 and the top electrode layer 121 are patterned using the patterned mask 400 as an etch mask. In some embodiments, a first etching process 702 is performed to remove portions of the phase change material layer 119 and portions of the top electrode layer 121 exposed by the patterned mask 400. Stated another way, the first etching process 702 is performed by exposing the phase change material layer 119 and the top electrode layer 121 uncovered by the patterned mask 400 to an etchant of the first etching process 702. After the first etching process 702, the remaining phase change material layer 119 is referred to as the PCE 120, and the remaining top electrode layer 121 is referred to as the top electrode 122.

In some embodiments, the etchant of the first etching process 702 may be or include a first reactive species. In some embodiments, the first reactive species may, for example, be or include a halogen element such as fluorine (F), chlorine (Cl), bromine (Br), iodine (I), and/or astatine (At), or some other suitable element and/or compound that reacts and/or combines with a first outer region 120a and a second outer region 120c, while leaving a center region 120b made of the first material and substantially free from the first reactive species. Thus, center region 120b includes the first material (e.g., GeSbTe) and substantially free from the first reactive species, and the first and second outer regions 120a and 120c include a compound of the first reactive species and the first material. In some embodiments, the atomic concentration of the first reactive species in the outer regions 120a and 120c is in a range from about $10^3$ atoms/cm$^3$ to about $10^{13}$ atoms/cm$^3$, while the atomic concentration of the first reactive species in the center region 120b is substantially equal to zero value or lower than about $10^3$ atoms/cm$^3$.

In various embodiments, the compound may, for example, be or include GeSbTe combined with fluorine (F), chlorine (Cl), bromine (Br), iodine (I), and/or astatine (At). The compound has a first melting point temperature, a first boiling point temperature, and a first sublimation point temperature. The first material has a second melting point temperature, a second boiling point temperature, and a second sublimation point temperature. In some embodiments, the first melting point temperature, the first boiling point temperature, and the first sublimation point temperature are less than the second melting point temperature, the second boiling point temperature, and the second sublimation point temperature, respectively. Stated another way, the outer regions 120a and 120c has a melting point temperature, a boiling point temperature, and a sublimation point temperature lower than the center region 120b. In various embodiments, the first melting point temperature is within a range of approximately 200 degrees Celsius to approximately 400 degrees Celsius. In various embodiments, the second melting point temperature is within a range of approximately 550 degrees Celsius to approximately 650 degrees Celsius.

Figure 10:
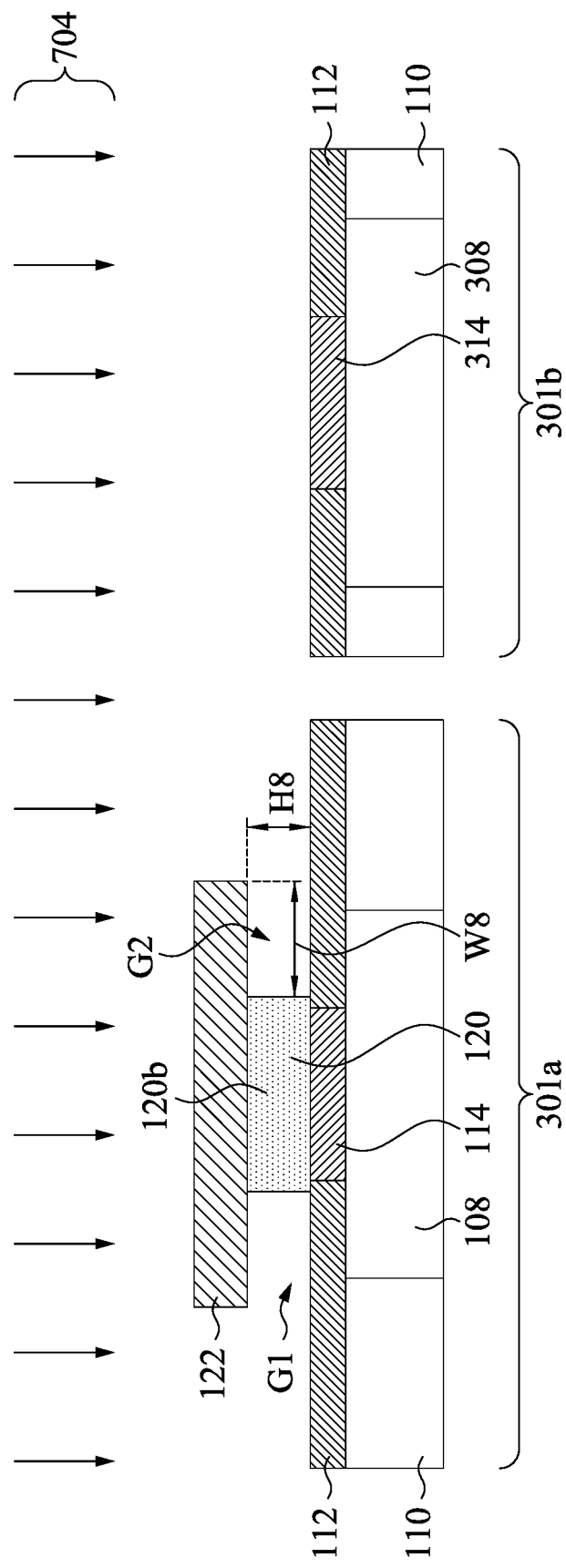

In some embodiments where air gaps G1 and G2 are formed using melting, evaporating and/or sublimating the outer regions 120a and 120c in a following step (as shown in FIG. 10), conditions of the etching process 702 are controlled such that the outer regions 120a and 120c each have a ratio of a width W7 to a height H7 in range from about 0.5 to about 5. Such a width/height ratio of the outer regions 120a and 120c will be beneficial in creating unfilled air gaps. In some embodiments, the width W7 is in a range from about 5 nm to about 100 nm, and the height H7 is in a range from about 10 nm to about 50 nm.

As shown in cross-sectional view of FIG. 10, a thermal treatment 704 is performed to melt, evaporate and/or sublimate the first outer region 120a and the second outer region 120c. In some embodiments, the thermal treatment 704 may heat the wafer by raising the temperature to melt/evaporate/sublimation the first outer region 120a and the second outer region 120c of the PCE 120. In greater detail, the thermal treatment 704 reaches a maximum temperature greater than the first melting point temperature and less than the second melting point temperature. As a result, after the thermal treatment 704, the first outer region 120a and the second outer region 120c of the PCE 120 (see FIG. 9) are removed, leaving air gaps G1 and G2 in place of the removed first outer region 120a and the removed second outer region 120c, respectively. The center region 120b of the PCE 120 is not removed by the thermal treatment 704, because the center region 120b of the PCE 120 has a higher melting/boiling/sublimation point than that of the removed outer regions 120a and 120c. Accordingly, the center region 120b of the PCE 120, which includes the first material and substantially free from the first reactive species, is exposed to the air gaps G1 and G2. That is, the remaining portions of the PCE 120 that are exposed to the air gaps G1 and G2 may be, for example, GeSbTe free from the first reactive species. In some embodiments, the temperature of the thermal treatment 704 is in a range from approximately 200 degrees Celsius to approximately 400 degrees Celsius. If the temperature of the thermal treatment 704 is too low (e.g., far below about 200 degrees Celsius), the thermal treatment 704 may be unable to melt, evaporate and/or sublimate the first outer region 120a and the second outer region 120c of the PCE 120 because the temperature may not reach the melting point, boiling point, and/or sublimation point of the first outer region 120*a* and the second outer region 120*c* (e.g., the compound of the GeSbTe and the first reactive species). If the temperature of the thermal treatment 704 is too high (e.g., far exceed about 400 degrees Celsius), the thermal treatment 704 may cause unwanted consumption of the center region 120*b* because the temperature may exceed the melting point, boiling point and/or sublimation point of the center region 120*b* (e.g., GeSbTe free from the first reactive species).

The thermal treatment 704 results in a narrowed PCE 120 and air gaps G1 and G2 self-aligned to the PCE 120. As mentioned before, the phase change mechanism is dominated by Joule heating resulting from electric current flowing through the PCE 120. Because the PCE 120 has a reduced width resulting from the thermal treatment 704, the resistance of the PCE 120 is increased. Moreover, because Joule heat is in positive correlation with a resistance of the associated electric current path, the set current $I_{set}$ for generating Joule heat sufficient to change the PCE 120 to the crystalline phase can be reduced. Similarly, the reset current $I_{reset}$ for generating Joule heat sufficient to change the PCE 120 to the amorphous phase is reduced as well.

Because the air gaps G1 and G2 result from removal of the outer regions 120*a* and 120*c* of the PCE 120, the air gaps G1 and G2 inherit geometry (e.g., shape and size) of the outer regions 120*a* and 120*c*. As a result, the air gaps G1 and G2 each have a ratio of a width W8 to a height H8 in range from about 0.5 to about 5. In some embodiments, the width W8 is in a range from about 5 nm to about 100 nm, and the height H8 is in a range from about 10 nm to about 50 nm.

Figure 11:
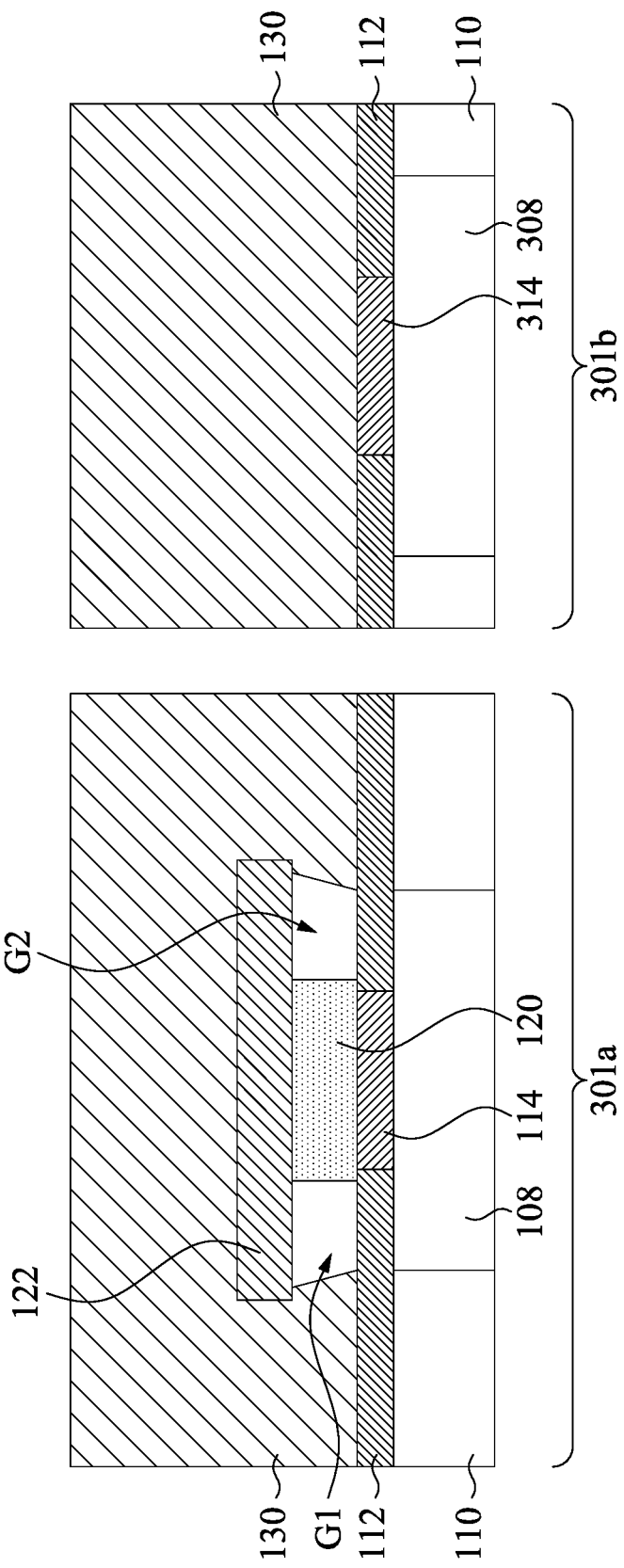

As shown in cross-sectional view of FIG. 11, a deposition process is performed to form the IMD layer 130 over the dielectric layer 112 and sealing the air gaps G1 and G2 under the top electrode 122. In some embodiments, the IMD layer 130 may be formed by suitable process, such as CVD, PVD, ALD, spin-on process, or the like. As mentioned above, because the air gaps G1 and G2 each have a ratio of a width W8 to a height H8 in range from about 0.5 to about 5, the air gaps G1 and G2 can remain unfilled after forming the IMD layer 130. Moreover, the air gaps G1 and G2 can be sealed by the IMD layer 130, so that following steps in the BEOL are unable to fill the air gaps G1 and G2 as well. In this way, the void gaps G1 and G2 can be observed in an image of a final product taken using an imaging tool (e.g., SEM, TEM or the like). Moreover, because air in the gaps G1 and G2 may have a lower thermal conductivity and higher thermal insulation than materials in the PCE 120 and/or the IMD layer 130, less Joule heat is needed to perform the set operation and/or reset operation of the PCE 120, thus reducing the set current Let and/or the reset current $I_{reset}$.

In some embodiments, the IMD layer 130 may include portions 130P that slightly extend to positions that are under the top electrode 122. In greater detail, the portions 130P extend between the bottom surface of the top electrode 122 and the dielectric layer 112 and are below the top electrode 122. The structural details of the portions 130P have been discussed in FIG. 1A, and thus relevant discussion will not be repeated hereinafter for brevity.

Figure 12:
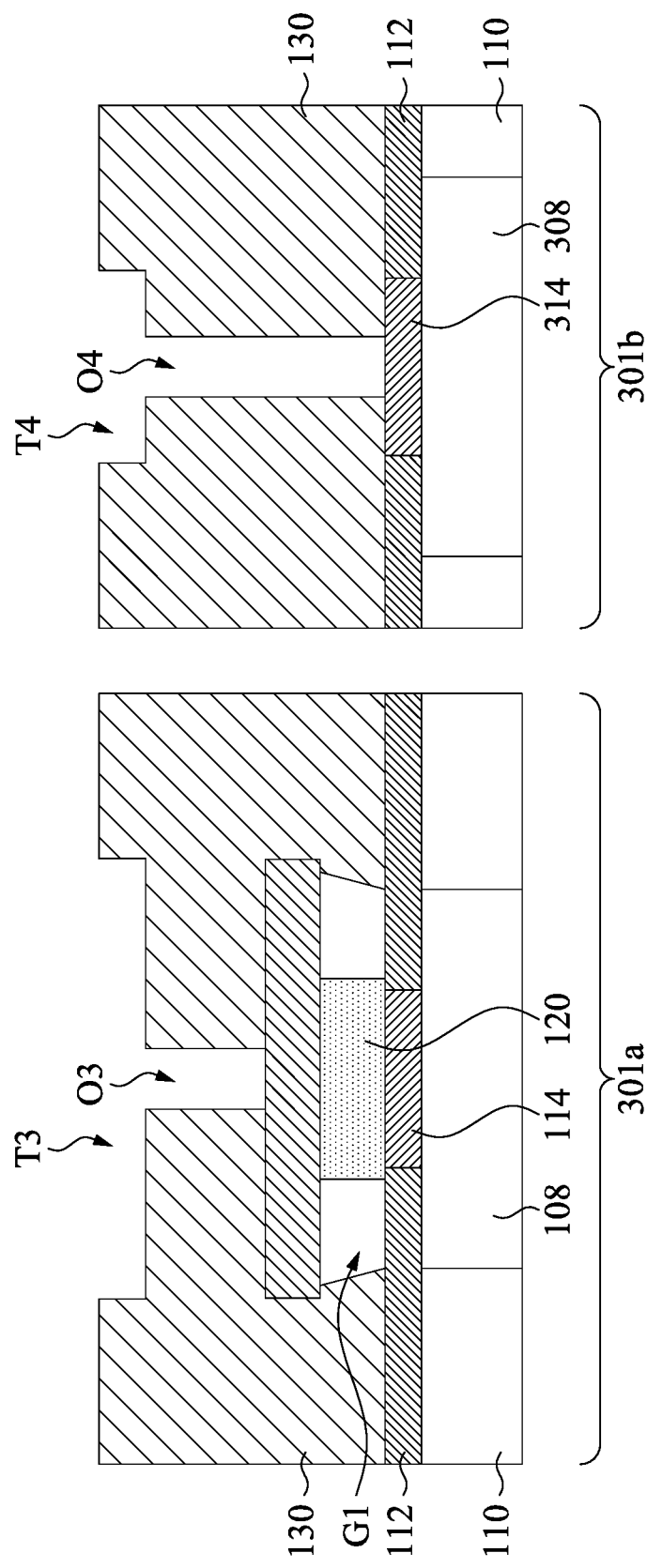

As shown in cross-sectional view of FIG. 12, the IMD layer 130 is patterned to form a via opening O3 in the memory array region 301*a* and a trench V3 over the via opening O3, and a via opening O4 in the logic region 301*b* and a trench V4 over the via opening V4. The opening O3 exposes the top surface of the top electrode 122, and the opening O4 exposed the top surface of the conductive via 314. In some embodiments, the via openings O3 and O4 and the trenches V3 and V4 may be formed in the IMD layer 130 using a dual damascene process.

Figure 13:
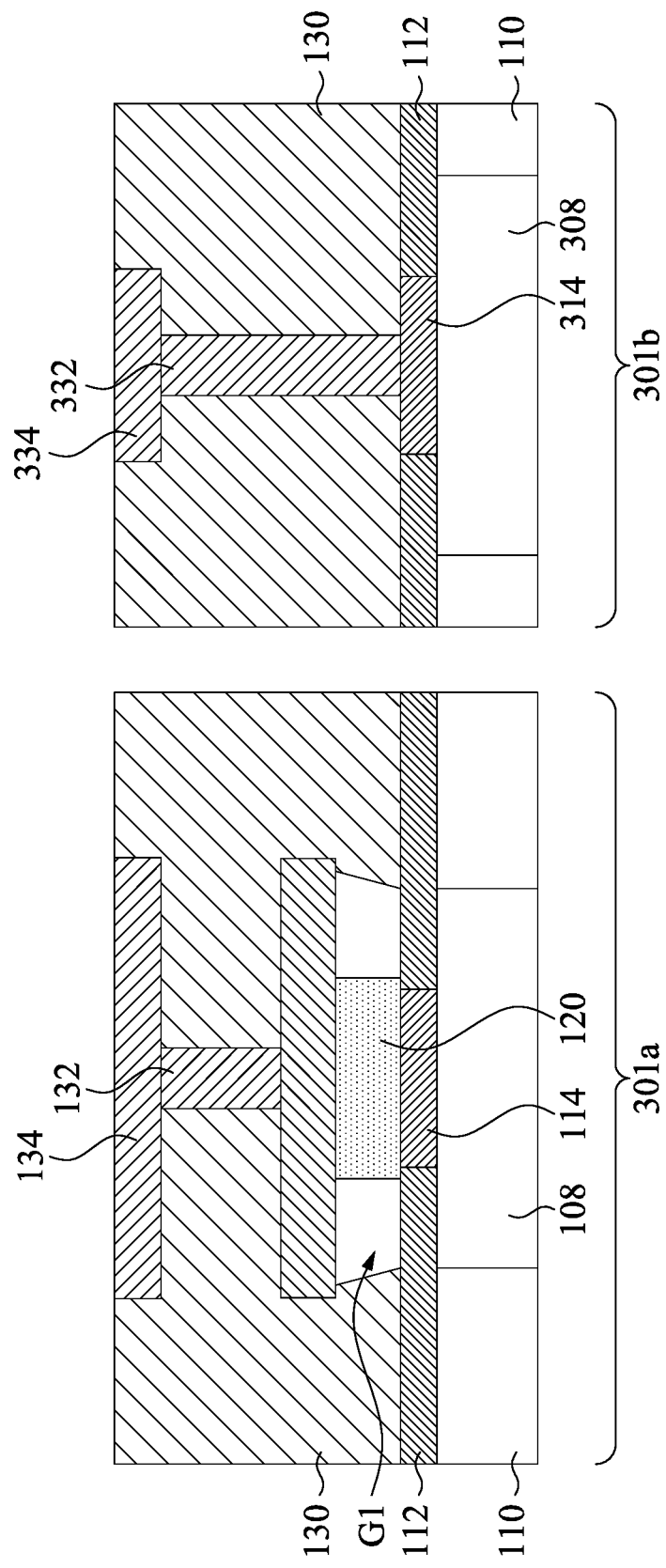

As shown in cross-sectional view of FIG. 13, conductive vias 132 and 332 are formed respectively in the openings O3 and O4, and conductive wires 134 and 334 are formed respectively in the trenches T3 and T4. In some embodiments, a deposition process is performed to deposit one or more conductive layers to overfill the via openings O3 and O4 and trenches, and followed by one or more CMP process(es) to remove excessive conductive material until the IMD layer 130 is exposed. In some embodiments, the conductive via 132 and the upper conductive wire 134 may have no distinguishable interface therebetween, if they are deposited is a same deposition process as discussed above. Based on similar reasons, the conductive via 332 and the upper conductive wire 334 may have no distinguishable interface therebetween.

Figure 14:
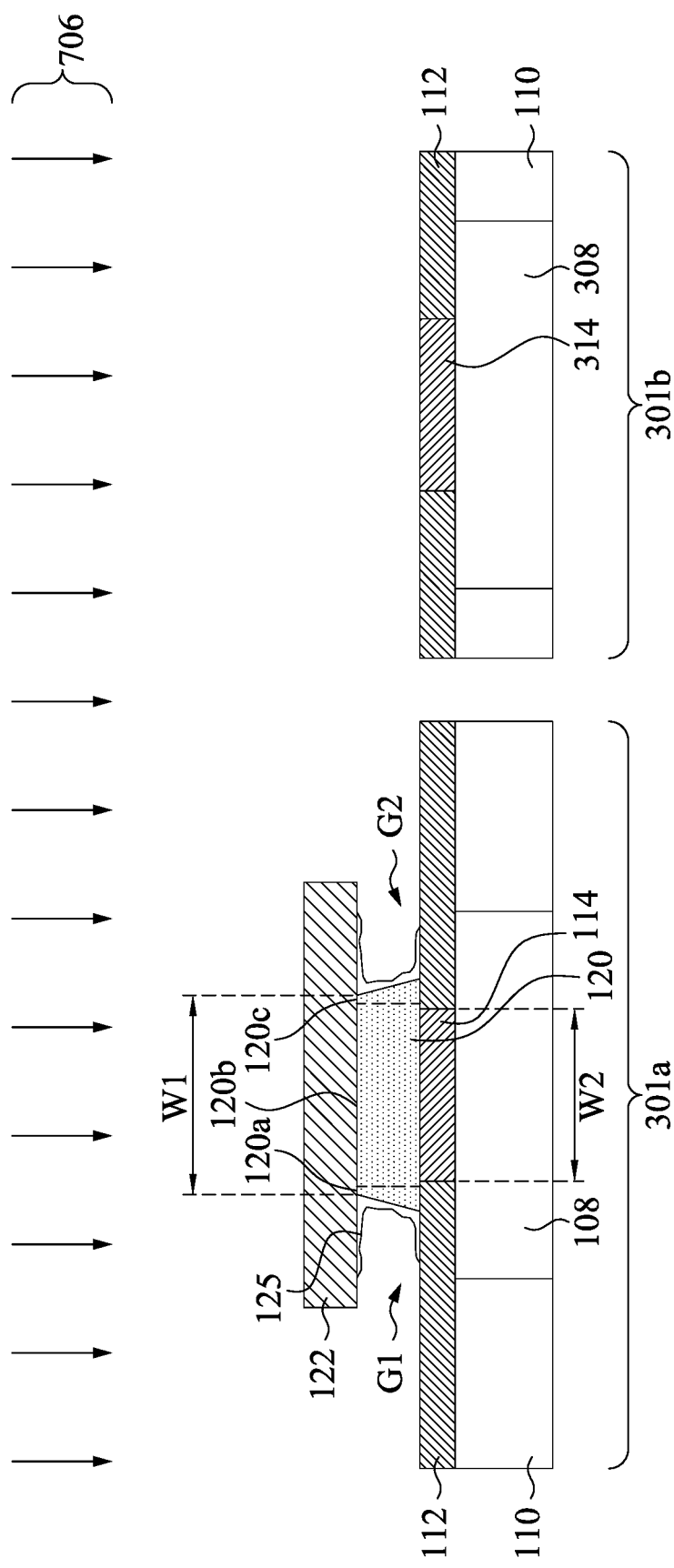
FIGS. 14 and 15 are cross-sectional views of a memory device in various stages of fabrication in accordance with some embodiments of the present disclosure.

As shown in cross-sectional view of FIG. 14, shown there is another example for narrowing the PCE 120 in accordance to some embodiments of the present disclosure. This step is performed in place of the thermal treatment 704 as shown in FIG. 10. After performing the first etching process 702, a second etching process 706 is performed to narrow the PCE 120. In some embodiments, the PCE 120 and the top electrode 122 have etching selectivity to the second etching process 706. For example, the top electrode 122 has higher etching resistance to the etchant of the second etching process 706 than that of the outer regions 120*a* and 120*c* of the PCE 120. Stated differently, the second etching process 706 etches the outer regions 120*a* and 120*c* of the PCE 120 at a faster etch rate than it etches the top electrode 122. Accordingly, during the second etching process 706, the etchant of the second etching process 706 may remove portions of the outer regions 120*a* and 120*c* of the PCE 120, while keeps the top electrode 122 substantially intact. The patterned mask 400 (as shown in FIG. 9) can be removed from the top electrode 122 after or prior to the second etching process 706.

In some embodiments, the PCE 120 and the top electrode 122 have higher etching selectivity in the second etching process 706 than in the first etching process 702 of FIG. 9. More particularly, the top electrode 122 has higher etching resistance to the etchant of the second etching process 706 than that of the first etching process 702. In some embodiments, the first etching process 702 is an anisotropic etching process, while the second etching process 706 is an isotropic etching process. For example, the first etching process 702 may be a dry etching process, and the second etching process 706 may be a wet etching process. In some other embodiments, the first etching process 702 and the second etching process 706 are anisotropic etching process, such as dry etching process.

In some embodiments, the etchant of the first etching process 702 in FIG. 9 is different from the etchant of the second etching process 706. For example, the etchant of the first etching process 702 may include the first reactive species as discussed with respect to FIG. 9, while the etchant of the second etching process 706 may include a second reactive species different from the first reactive species. In some embodiments, the second reactive species may, for example, be or includes a different halogen element (e.g., fluorine, chlorine, bromine, or other group 17 element) than the halogen element of the first reactive species as discussed previously. In some other embodiments, the second reactive species may, for example, be or comprise phosphorus (P), sulfur (S), and/or nitrogen (N).

During narrowing the PCE 120, the second reactive species of the etchant of the second etching process 706 may react and/or combine with the first outer region 120a and a second outer region 120c that include a compound of the chalcogenide material and the first reactive species, which in turn forms air gaps G1 and G2 and a plurality of polymer residues 125 in the air gaps G1 and G2 as a byproduct of the second etching process 706. As a result, the polymer residues 125 may be a compound of a material of the chalcogenide material of the PCE 120 (e.g., GeSbTe), the first reactive species, and a second reactive species. The polymer residues 125 may cover and contact the sidewalls of the PCE 120, the bottom surface of the top electrode 122, and the top surface of the dielectric layer 112. In some embodiments, the atomic concentration of the second reactive species of the polymer residues 125 is in a range from about $10^3$ atoms/cm$^3$ to about $10^{13}$ atoms/cm$^3$, and the atomic concentration of the second reactive species of the remaining PCE 120 (i.e., remaining first and second outer regions 120a, 120c and the center region 120b) is substantially equal to zero value or lower than about $10^3$ atoms/cm$^3$.

In some embodiments, portions of the first outer region 120a and the second outer region 120c remain after the second etching process 706. As a result, the structure includes the center region 120b, the first and second outer regions 120a and 120c, and polymer residues 125. In some embodiments, the center region 120b may include chalcogenide material, such as GeSbTe, without the first and second reactive species. The first and second outer regions 120a and 120c may include a compound of a material of chalcogenide material and first reactive species without the second reactive species. The polymer residues 125 may include a compound of a material of the chalcogenide material of the PCE 120 (e.g., GeSbTe), the first reactive species, and a second reactive species. In other words, the polymer residues 125 have a higher atomic concentration of the second reactive species than the outer regions 120a and 120c of the PCE 120, and the outer regions 120a and 120c of the PCE 120 has a higher atomic concentration of the first reactive species than the center region 120b of the PCE 120. Notably, the center region 120b of the PCE 120 ideally has a zero value in the first reactive species concentration, but in a final product the center region 120b of the PCE 120 may have a non-zero value (e.g., positive value) in the first reactive species concentration due to unintentional thermal diffusion in following steps in the BEOL. Due to similar reasons, the outer regions 120a and 120c of the PCE ideally has a zero value in the second reactive species concentration, but in a final product the outer regions 120a and 120c of the PCE 120 may have a non-zero value in the second reactive species.

In some embodiments where the second etching process 706 is a wet etching process, the etchants of the second etching process 706 may include diluted hydrofluoric acid (DHF), phosphoric acid ($H_3PO_4$), sulfuric acid ($H_2SO_4$), and nitric acid ($HNO_3$).

In some embodiments where the second etching process 706 is a dry etching process, the etching process may be a chemical etching, such as reactive-ion retching (RIE), or a physical etching, such as sputtering. For example, the etchants of a chemical dry etching may include chlorine gas ($Cl_2$), hydrobromic acid (HBr), methane ($CH_4$), and difluoromethane ($CH_2F_2$).

In some other embodiments, the second etching process 706 is a physical dry etching process using (Ar) and/or hydrogen ($H_2$) as its etchants.

Figure 15:
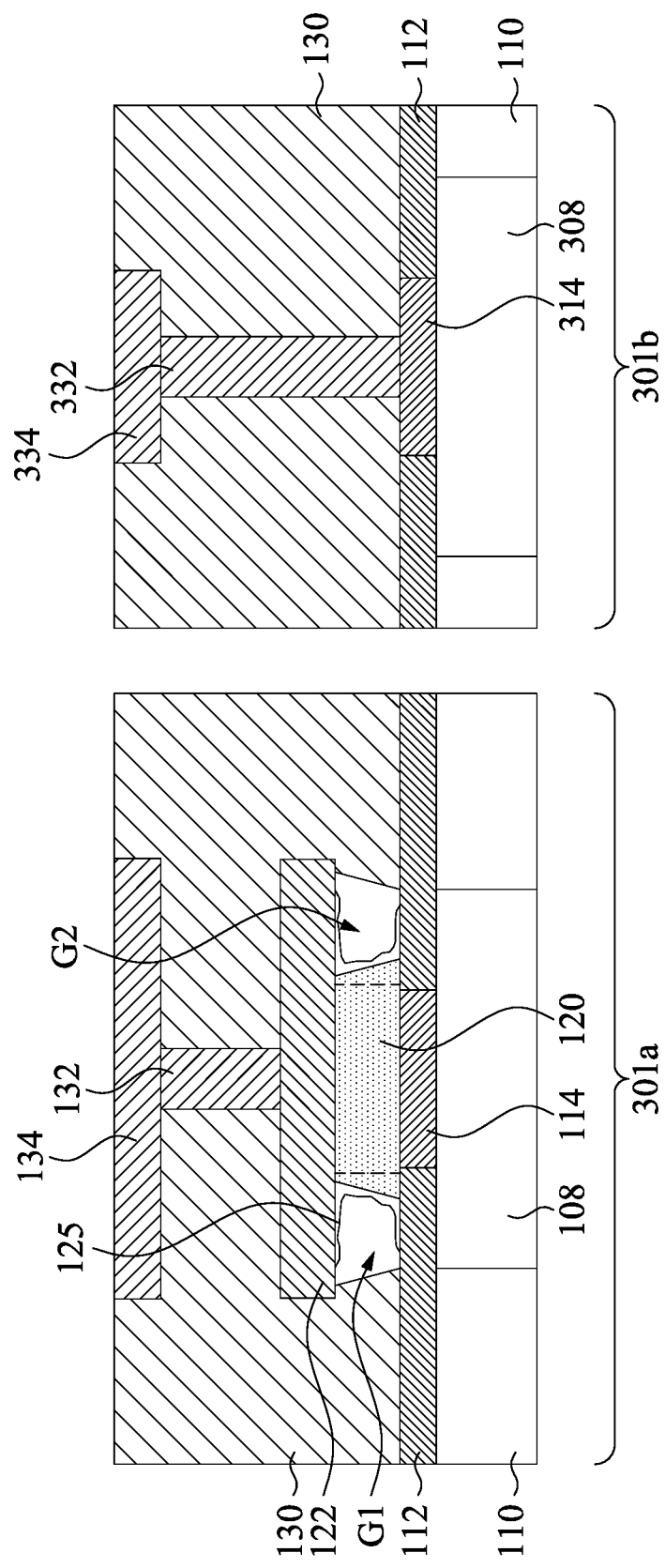

As shown in cross-sectional view of FIG. 15, the IMD layers 130, the conductive vias 132 and 332, and the upper conductive wires 134 and 334 are formed. It is noted that the structure shown in FIG. 15 is the same or similar to those described in FIGS. 11 to 13, and thus relevant structural details will not be repeated hereinafter for brevity.

Figure 16:
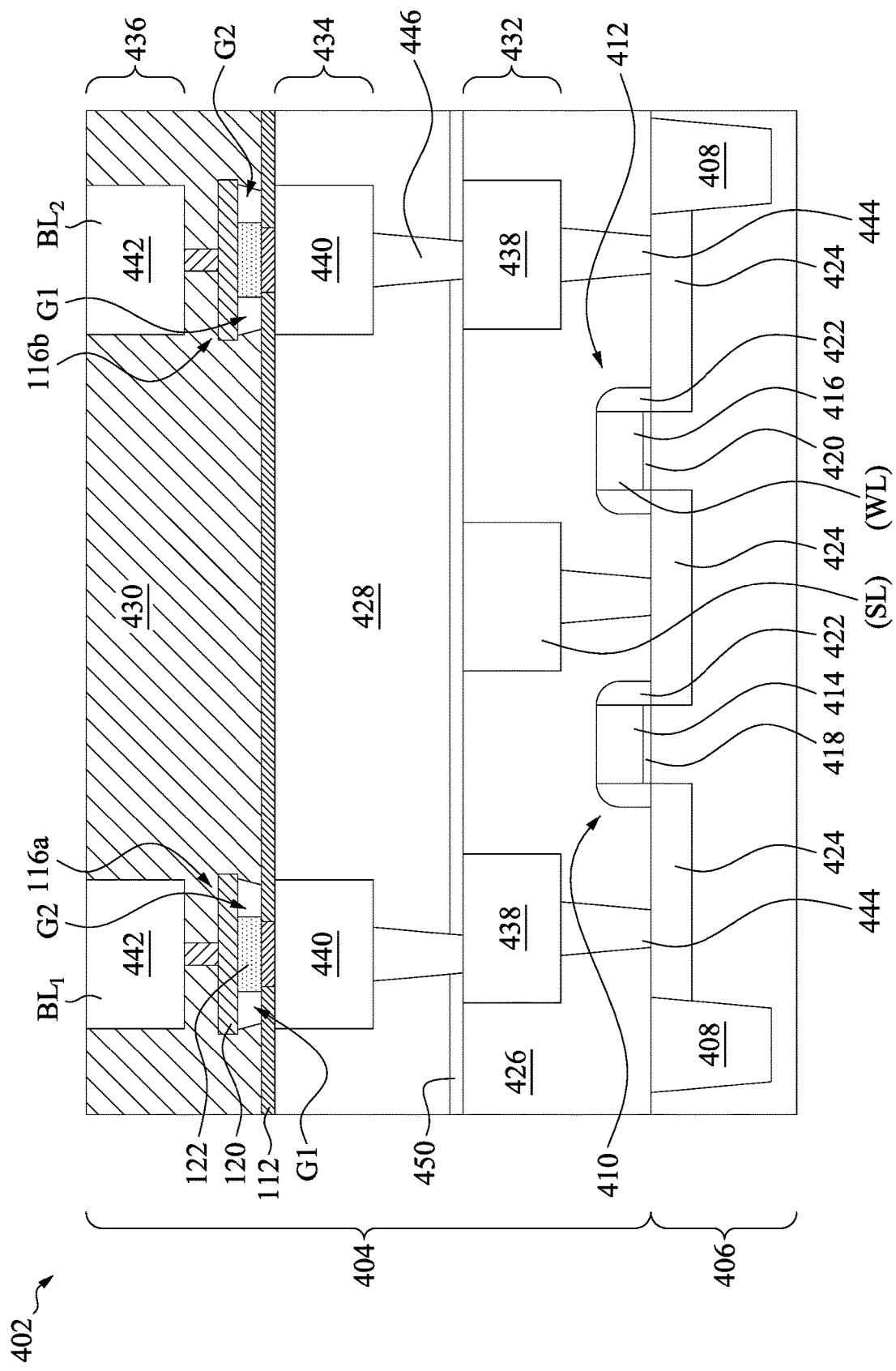
FIG. 16 is a cross-sectional view of a memory device in according to some embodiments of the present disclosure.

Referring to FIG. 16, a cross sectional view of some embodiments of an integrated circuit 402, which includes a first memory cell 116a and a second memory cell 116b disposed in an interconnect structure 404 of the integrated circuit 402. In some embodiments shown in FIG. 16, the first and second memory cells 116a, 116b are the PCM cell 116 of FIG. 1A. However, the first and second memory cells 116a, 116b can also be the PCM cell 116 of FIG. 2 as illustrated and described.

The integrated circuit 402 includes a substrate 406. The substrate 406 may be, for example, a bulk substrate (e.g., a bulk silicon substrate) or a silicon-on-insulator (SOI) substrate. The illustrated embodiment depicts one or more shallow trench isolation (STI) regions 408, which may include a dielectric-filled trench within the substrate 406.

Two access transistors 410, 412 are disposed between the STI regions 408. The access transistors 410, 412 include access gate electrodes 414, 416, respectively; access gate dielectrics 418, 420, respectively; access sidewall spacers 422; and source/drain regions 424. The source/drain regions 424 are disposed within the substrate 406 between the access gate electrodes 414, 416 and the STI regions 408, and are doped to have a first conductivity type which is opposite a second conductivity type of a channel region under the gate dielectrics 418, 420, respectively. The access gate electrodes 414, 416 may be, for example, doped polysilicon or a metal, such as aluminum, copper, or combinations thereof. The access gate dielectrics 418, 420 may be, for example, an oxide, such as silicon dioxide, or a high κ dielectric material. The access sidewall spacers 422 can be made of silicon nitride (e.g., $Si_3N_4$), for example. In some embodiments, the access transistor 410 and/or the access transistor 412 may, for example, be electrically coupled to a word line (WL) such that an appropriate WL voltage can be applied to the access gate electrode 414 and/or the access gate electrode 416.

The interconnect structure 404 is arranged over the substrate 406 and couples devices (e.g., transistors 410, 412) to one another. The interconnect structure 404 includes a plurality of IMD layers 426, 428, 430, and a plurality of metallization layers 432, 434, 436 which are layered over one another in alternating fashion. The IMD layers 426, 428, 430 may be made, for example, of a low κ dielectric, such as un-doped silicate glass, or an oxide, such as silicon dioxide, or an extreme low κ dielectric layer. The metallization layers 432, 434, 436 include metal lines 438, 440, 442, which are formed within trenches, and which may be made of a metal, such as copper or aluminum. Contacts 444 extend from the bottom metallization layer 432 to the source/drain regions 424 and/or gate electrodes 414, 416; and vias 446 extend between the metallization layers 432, 434, 436. The vias 446 extend through dielectric-protection layers 450 (which can be made of dielectric material and can act as an etch stop layer during manufacturing). The dielectric-protection layer 450 may be made of an extreme low κ dielectric material, for example. The contacts 444 and the vias 446 may be made of a metal, such as copper or tungsten, for example.

The first and second memory cells 116a, 116b, which are configured to store respective data states, are arranged within the interconnect structure 404 between neighboring metal layers. The first and second memory cells 116a, 116b respectively include: a bottom electrode 114, a phase change element (PCE) 120, and a top electrode 122. In some embodiments, the first and second memory cells 116a, 116b are respectively connected to a first bit-line ($BL_1$) and a second bit-line ($BL_2$) through the metal lines 442.

Figure 17:
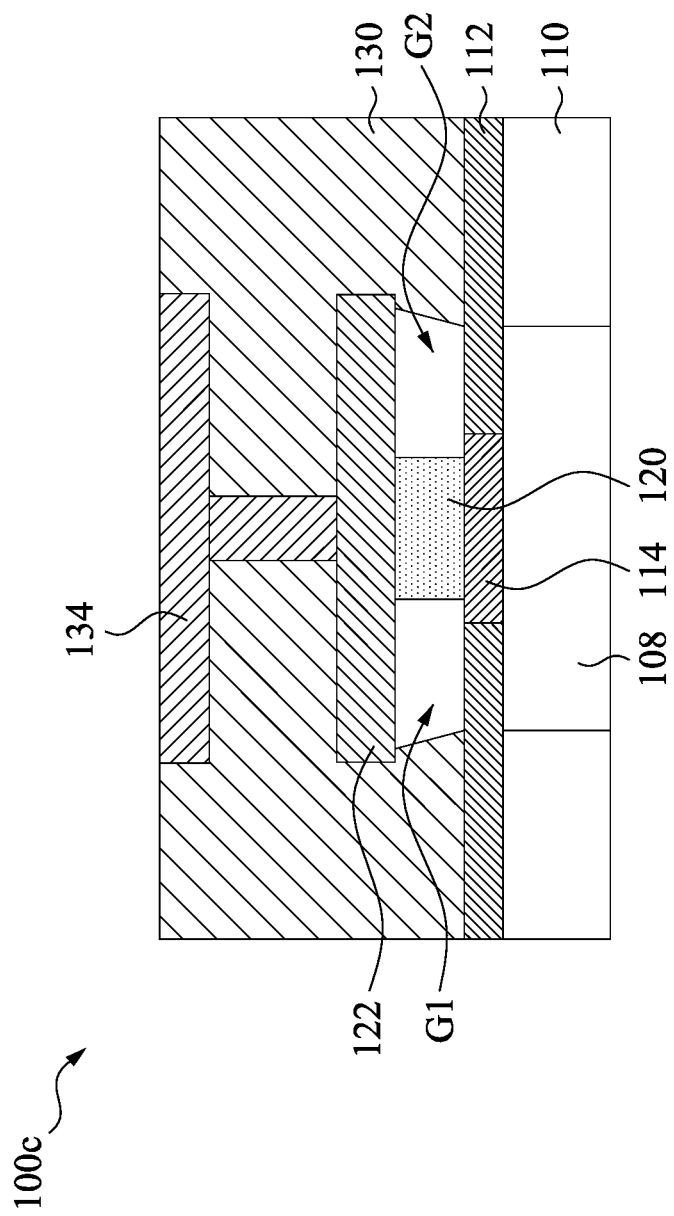
FIG. 17 is a cross-sectional view of a memory device in according to some embodiments of the present disclosure.

FIG. 17 is a cross-sectional view of a memory device 100c in according to some embodiments of the present disclosure. The structure of FIG. 17 is similar to those described in FIGS. 1A and 3, except that the PCE 120 of FIG. 17 is narrower than the bottom electrode 114. Accordingly, the top surface of the bottom electrode 114 may be exposed to the air gaps G1 and G2. It is noted that, the width of the PCE 120 shown in FIG. 17 can be controlled by the thermal treatment 704 described in FIG. 10. For example, the duration of the thermal treatment 704 can be controlled such that the outer regions 120a and 120c of the PCE 120 are melted/evaporated/sublimated until the maximum width of the PCE 120 is smaller than the width of the bottom electrode 114.

Figure 18:
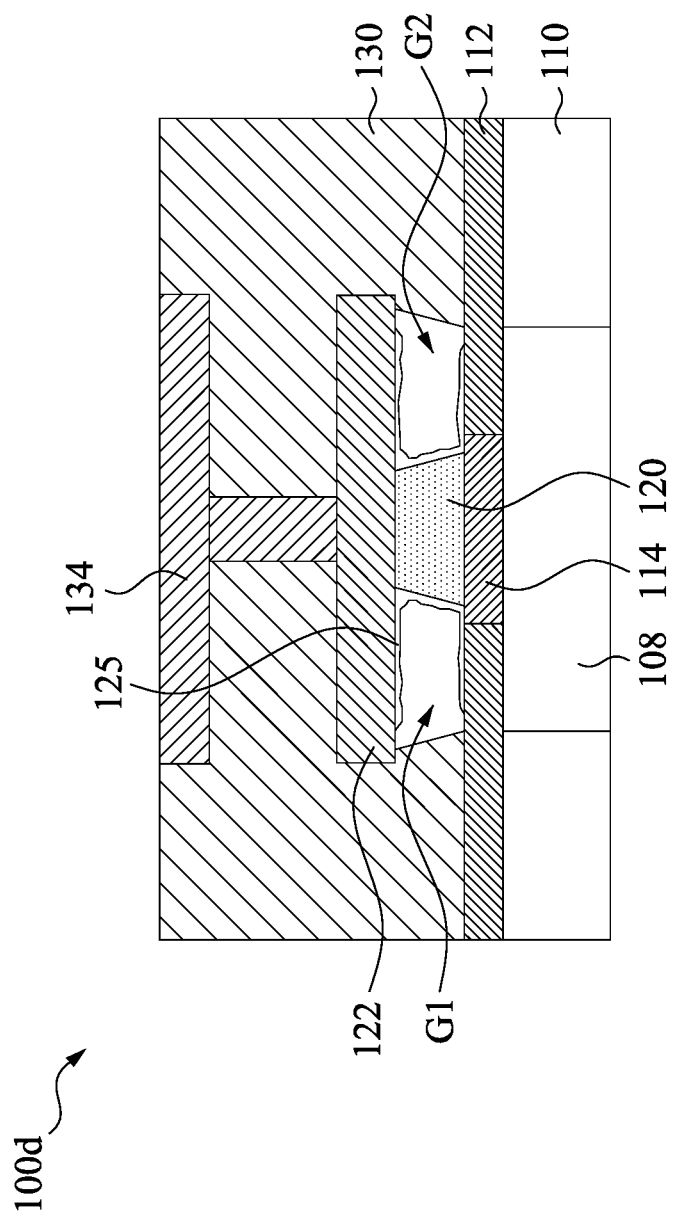
FIG. 18 is a cross-sectional view of a memory device in according to some embodiments of the present disclosure.

FIG. 18 is a cross-sectional view of a memory device 100d in according to some embodiments of the present disclosure. The structure of FIG. 18 is similar to those described in FIGS. 2 and 4, expect that the PCE 120 of FIG. 18 is narrower than the bottom electrode 114. Accordingly, the top surface of the bottom electrode 114 may be in contact with the polymer residues 125. It is noted that, the width of the PCE shown in FIG. 18 can be controlled by the second etching process 706 described in FIG. 15. For example, the duration of the second etching process 706 can be controlled such that the PCE 120 is etched until the maximum width of the PCE 120 is smaller than the width of the bottom electrode 114.

Figure 19A:
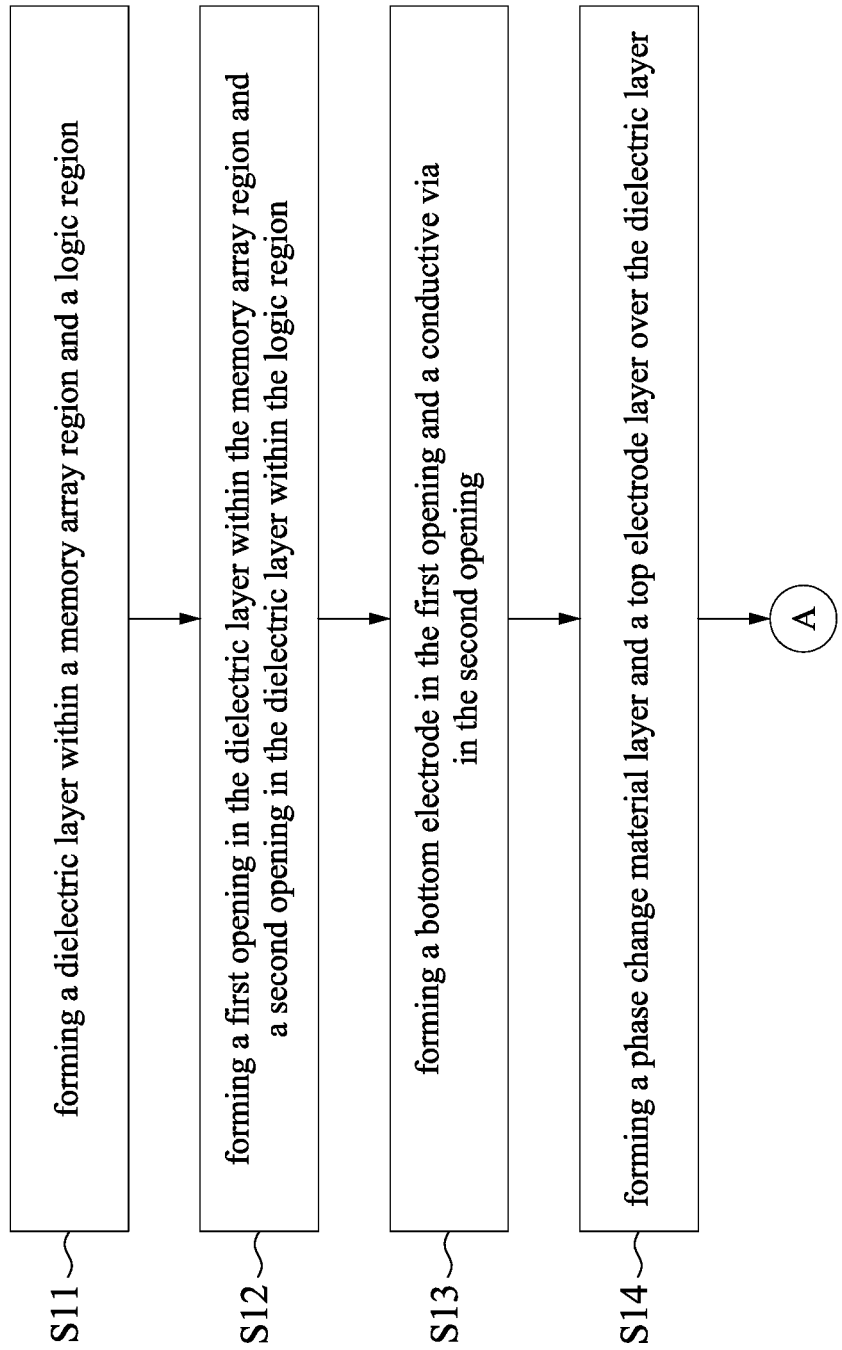
FIGS. 19A and 19B illustrate a method of forming a memory device in accordance with some embodiments of the present disclosure.
Figure 19B:
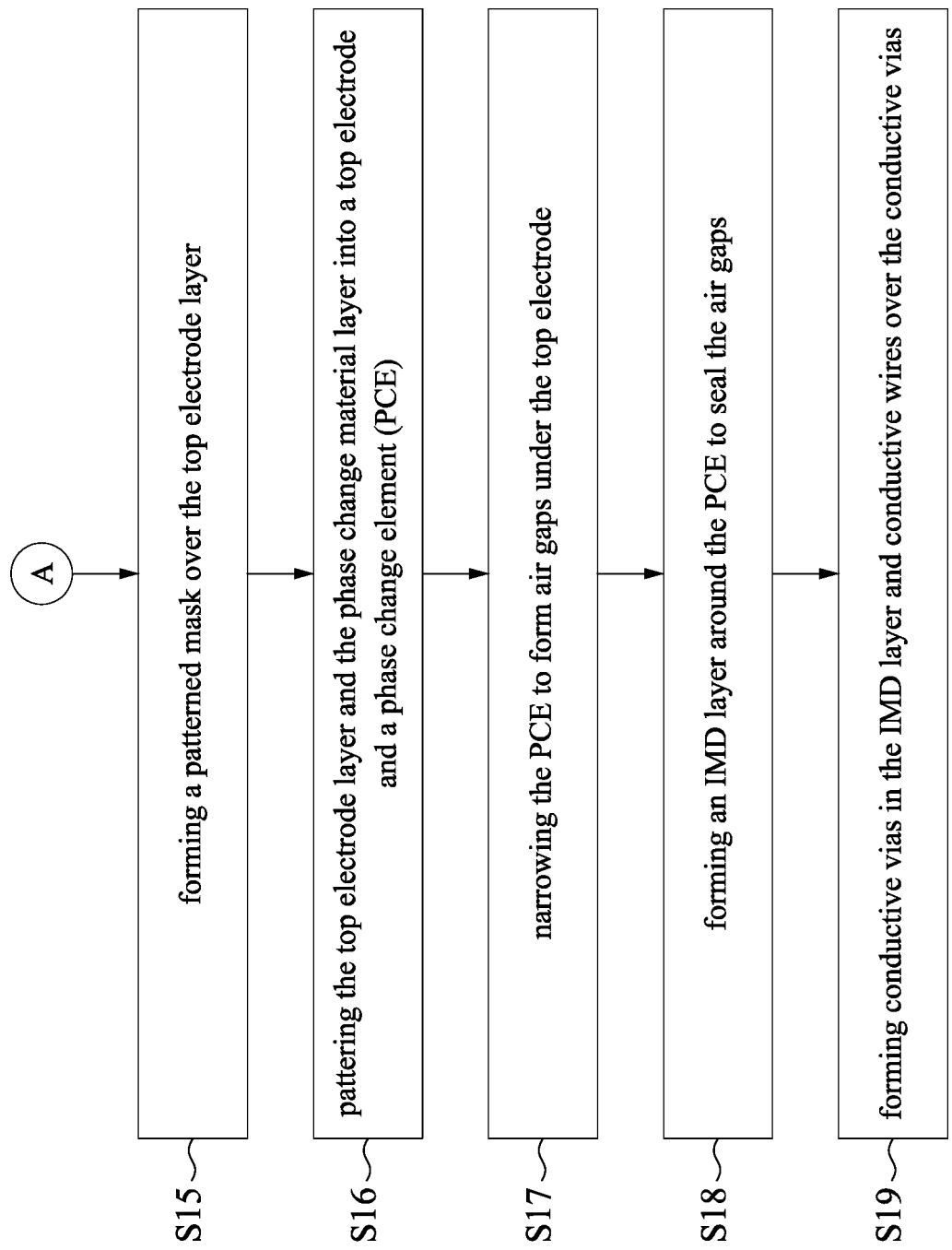

FIGS. 19A and 19B illustrate a method M of forming a memory device in accordance with some embodiments. Although the method M is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S11, a dielectric layer is formed over an IMD layer within a memory array region and a logic region. FIG. 5 illustrates a cross-sectional view of some embodiments corresponding to act in block S11.

At block S12, first and second openings are formed in the dielectric layer, wherein the first opening is formed within the memory array region and the second opening is formed in the logic region. FIG. 6 illustrates a cross-sectional view of some embodiments corresponding to act in block S12.

At block S13, a bottom electrode of a PCRAM device is formed in the first opening in the dielectric layer, and a conductive via is formed in the second opening in the dielectric layer. FIG. 7 illustrates a cross-sectional view of some embodiments corresponding to act in block S13.

At block S14, a phase change material layer and a top electrode layer are formed in sequence over the dielectric layer.

At block S15, a mask layer is formed over the top electrode layer and patterned to form a patterned mask within the memory array region. FIG. 8 illustrates a cross-sectional view of some embodiments corresponding to acts in blocks S14 and S15.

At block S16, the top electrode layer and the phase change material layer are patterned into a top electrode and a PCE using the patterned mask as an etch mask. FIG. 9 illustrates a cross-sectional view of some embodiments corresponding to act in block S16.

At block S17, the PCE are narrowed to form air gaps under the top electrode. FIGS. 10 and 14 illustrate cross-sectional views of some embodiments corresponding to act in block S17.

At block S18, another IMD layer is formed around the PCE to seal air gaps under the top electrode. FIGS. 11 and 15 illustrate cross-sectional views of some embodiments corresponding to act in block S18.

At block S19, conductive vias are formed in the IMD layer, and conductive wires are formed over the conductive vias. FIGS. 13 and 15 illustrate cross-sectional views of some embodiments corresponding to act in block S19.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. One advantage is that a thermal treatment and/or an etching process is performed to narrow a phase change element (PCE) so as to increase the resistance of the PCE, and thus the set current $I_{set}$ for generating Joule heat sufficient to change the PCE to the crystalline phase can be reduced. Similarly, the reset current $I_{reset}$ for generating Joule heat sufficient to change the PCE to the amorphous phase is reduced as well. Moreover, the gaps resulting from narrowing the PCE can remain unfilled after deposition of the IMD layer around the PCE. Therefore, less Joule heat is needed to perform the set operation and/or reset operation of the PCE, thus reducing the set current $I_{set}$ and/or the reset current $I_{reset}$, because air gaps may have a lower thermal conductivity and higher thermal insulation than materials in the PCE and/or the IMD layer.

In some embodiments of the present disclosure, a memory device includes a dielectric layer, a bottom electrode, an inter-metal dielectric (IMD) layer, a phase change element in the IMD layer, and a top electrode. The bottom electrode is in the dielectric layer. The IMD layer is over first dielectric layer. The phase change element is in the IMD layer. The top electrode is over the phase change element and is separated from the dielectric layer by at least an air gap free of materials of the IMD layer and the phase change element.

In some embodiments of the present disclosure, a memory device includes a dielectric layer, a bottom electrode, a phase change element, and a top electrode. The bottom electrode is in the dielectric layer. The phase change element is over the bottom electrode. The top electrode is over the phase change element, in which the phase change element has a top surface narrower than a bottom surface of the top electrode.

In some embodiments of the present disclosure, a method includes forming a bottom electrode in a dielectric layer; forming a phase change material layer over the bottom electrode; forming a top electrode layer over the phase change material layer; performing a first etching process to pattern the top electrode layer and the phase change material layer respectively into a top electrode and a phase change element; and narrowing the phase change element to form a gap under the top electrode; and forming an inter-metal dielectric (IMD) layer around the phase change element, in which the gap remains unfilled after forming the IMD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a dielectric layer;
   a bottom electrode in the dielectric layer;
   an inter-metal dielectric (IMD) layer over first dielectric layer;
   a phase change element in the IMD layer; and
   a top electrode over the phase change element and separated from the dielectric layer by at least an air gap free of materials of the IMD layer and the phase change element, wherein the IMD layer has a portion extending downwardly from a bottom surface of the top electrode to the dielectric layer.

2. The memory device of claim 1, wherein the phase change element has a bottom surface wider than the bottom electrode.

3. The memory device of claim 1, wherein a width of the portion of the IMD layer decreases as a distance from the dielectric layer increases.

4. The memory device of claim 1, wherein the IMD layer is in contact with a sidewall of the top electrode.

5. The memory device of claim 1, wherein the air gap has a width decreasing as a distance from the top electrode increases.

6. The memory device of claim 1, wherein the IMD layer is in contact with a top surface of the top electrode.

7. The memory device of claim 1, further comprising a polymer residue in contact with the bottom surface of the top electrode.

8. The memory device of claim 1, further comprising a polymer residue in contact with a sidewall of the bottom surface of the phase change element.

9. A memory device, comprising:
   a dielectric layer;
   a bottom electrode in the dielectric layer;
   a phase change element (PCE) over the bottom electrode;
   a top electrode over the phase change element, wherein the phase change element has a top surface having a width less than a width of a bottom surface of the top electrode; and
   a polymer residue on the bottom surface of the top electrode.

10. The memory device of claim 9, further comprising an inter-metal dielectric (IMD) material having an air gap laterally surrounding the PCE.

11. The memory device of claim 10, wherein the air gap narrows as the air gap extends toward the dielectric layer.

12. The memory device of claim 9, further comprising:
    an inter-metal dielectric (IMD) layer around the phase change element,
    wherein the polymer residue is between the phase change element and the IMD layer, the polymer residue comprises a first reactive species, and a concentration of the first reactive species in the polymer residue is greater than that in the PCE.

13. The memory device of claim 12, wherein the PCE is free from the first reactive species.

14. The memory device of claim 12, wherein the phase change element has an outer region and a center region surrounded by the outer region, the outer region has a second reactive species different from the first reactive species in the polymer residue, and a concentration of the second reactive species in the outer region is greater than that in the center region.

15. The memory device of claim 14, wherein the polymer residue includes the second reactive species.

16. The memory device of claim 14, wherein the center region of the PCE is free from the second reactive species.

17. A memory device, comprising:
    a dielectric layer;
    a bottom electrode in the dielectric layer;
    a phase change element over the bottom electrode;
    a top electrode over the phase change element; and
    a polymer residue having a first portion in contact with a bottom surface of the top electrode, a second portion in contact with a sidewall of the phase change element, and a third portion in contact with a top surface of the dielectric layer.

18. The memory device of claim 17, further comprising an inter-metal dielectric (IMD) layer around the phase change element, wherein the second portion of the polymer residue is separated from the IMD layer by an air gap.

19. The memory device of claim 18, wherein the first, second, and third portions of the polymer residue are exposed to the air gap.

20. The memory device of claim 17, wherein the third portion of the polymer residue is in contact with a top surface of the bottom electrode.

* * * * *